US010642945B2

(12) United States Patent
Zhou et al.

(10) Patent No.: US 10,642,945 B2
(45) Date of Patent: May 5, 2020

(54) STRUCTURAL WEAK SPOT ANALYSIS

(71) Applicant: New York University, New York, NY (US)

(72) Inventors: Qingnan Zhou, New York, NY (US); Denis Zorin, New York, NY (US); Julian Panetta, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 872 days.

(21) Appl. No.: 14/438,181

(22) PCT Filed: Oct. 23, 2013

(86) PCT No.: PCT/US2013/066439
§ 371 (c)(1),
(2) Date: Apr. 23, 2015

(87) PCT Pub. No.: WO2014/066538
PCT Pub. Date: May 1, 2014

(65) Prior Publication Data
US 2015/0278414 A1    Oct. 1, 2015

Related U.S. Application Data

(60) Provisional application No. 61/855,989, filed on May 29, 2013, provisional application No. 61/718,129, filed on Oct. 24, 2012.

(51) Int. Cl.
*G06F 17/50*    (2006.01)
(52) U.S. Cl.
CPC ............... *G06F 17/5018* (2013.01)

(58) Field of Classification Search
CPC .................................................. G06F 17/5018
USPC ............................................................. 703/2
See application file for complete search history.

(56) References Cited

U.S. PATENT DOCUMENTS

| | | | | | |
|---|---|---|---|---|---|
| 5,065,630 | A | * | 11/1991 | Hadcock | G01M 5/0016 73/802 |
| 6,768,974 | B1 | * | 7/2004 | Nanjundan | G09B 19/24 219/137 R |
| 6,862,539 | B2 | * | 3/2005 | Fields | G06F 17/5018 702/42 |

(Continued)

FOREIGN PATENT DOCUMENTS

WO    WO-2012/033425    3/2012

OTHER PUBLICATIONS

Zhou et al. ("Worst Case structural Analysis", ACM, 2013, pp. 137:1-137:11).*

(Continued)

*Primary Examiner* — Brian S Cook
*Assistant Examiner* — Iftekhar A Khan
(74) *Attorney, Agent, or Firm* — Foley & Lardner LLP

(57) ABSTRACT

A system and methods for weak spot analysis. A mesh shape is preprocessed to approximate an input model for an object. The mesh shape is analyzed with modal analysis to identify weak regions. A method and system for determining weak spots in an object. The method and system uses an optimization problem which is solved to determine a pressure distribution on the object maximizing maximal principal stress by solving a set of optimization problems maximizing stress for each point of the object.

10 Claims, 24 Drawing Sheets y=yellow

(56) References Cited

U.S. PATENT DOCUMENTS

| | | | | |
|---|---|---|---|---|
| 6,901,809 | B2* | 6/2005 | Dong | B23K 31/02 |
| | | | | 73/789 |
| 7,543,732 | B2* | 6/2009 | Kobayashi | B23K 11/11 |
| | | | | 148/500 |
| 9,081,922 | B2* | 7/2015 | Fouvry | G01N 3/56 |
| 9,308,690 | B2* | 4/2016 | Boyer | B33Y 10/00 |
| 2003/0074976 | A1* | 4/2003 | Ahmad | G01N 3/32 |
| | | | | 73/808 |
| 2004/0020642 | A1* | 2/2004 | Vinegar | B09C 1/02 |
| | | | | 166/245 |
| 2006/0058985 | A1* | 3/2006 | Arslan | G06F 17/5095 |
| | | | | 703/2 |
| 2009/0204345 | A1* | 8/2009 | Broddegaard | G01N 29/30 |
| | | | | 702/39 |
| 2011/0087350 | A1* | 4/2011 | Fogel | G06F 17/50 |
| | | | | 700/98 |
| 2012/0232857 | A1* | 9/2012 | Fisker | B29C 33/3835 |
| | | | | 703/1 |
| 2012/0239358 | A1* | 9/2012 | Yiu | G06F 17/5018 |
| | | | | 703/2 |
| 2012/0259593 | A1* | 10/2012 | El-Zein | G06F 17/5018 |
| | | | | 703/1 |
| 2013/0030771 | A1* | 1/2013 | Joseph | G06F 17/50 |
| | | | | 703/1 |
| 2014/0214370 | A1* | 7/2014 | Olhofer | G06F 17/50 |
| | | | | 703/1 |
| 2015/0308936 | A1* | 10/2015 | Huang | G06F 17/5018 |
| | | | | 703/1 |
| 2015/0316526 | A1* | 11/2015 | Kimmel | G01N 33/24 |
| | | | | 73/818 |

OTHER PUBLICATIONS

Allaire et al. ("Minimum stress optimal design with the level set method", Engineering Analysis with Boundary Elements 32 (2008) 909-918) (Year: 2008).*

Bickel et al. ("Design and Fabrication of Materials with Desired Deformation Behavior", ACM) (Year: 2010).*

The International Search Report and the Written Opinion of the International Searching Authority issued in PCT/US2013/066439, dated Feb. 6, 2014.

ASTM Designation: D5023-07, "Standard Test Method for Plastics: Dynamic Mechanical Properties: in Flexure (Three-Point Bending)", 2007, pp. 1-4, ASTM International, West Conshohocken, PA.

Bacher, M., et al., "Fabricating Articulated Characters from Skinned Meshes", ACM Transactions on Graphics, 2012, 31(4):47, 9 pages.

Barbic, J., et al., "Real-Time Subspace integration for St. Venant-Kirchhoff Deformable Models", ACM Transactions on Graphics, 2005, 24(3):982-900.

Barbic, J., et al., "Subspace Self-Collision Culling", ACM Transactions on Graphics, 2010, 29(4):81, 9 pages.

Bickel, B., et al., "Design and Fabrication of Materials with Desired Deformation Behavior", ACM Transactions on Graphics, 2010, 29(4):63, 10 pages.

Cali, J., et al., "3D-Printing of Non-Assembly, Articulated Models", ACM Transactions on Graphics, 2012, 31(6):130, 8 pages.

Davis, T.A., "Algorithm 832: UMFPACK V4.3—an unsymmetric-pattern multifrontal method", ACM Transactions on Mathematical Software, 2004, 30(2):196-199.

Dong, Y., et al., "Fabricating Spatially-Varying Subsurface Scattering", ACM Transactions on Graphics, 2010, 29(4):62, 10 pages.

Fidkowski, K.J., et al., "Stochastic Gust Analysis Techniques for Aircraft Conceptual Design", 12th AIAA/ISSMO Multidisciplinary Analysis and Optimization Conference, Sep. 10-12, 2008, pp. 1-16.

Hasan, M., et al., "Physical Reproduction of Materials with Specified Subsurface Scattering", ACM Transactions on Graphics, 2010, 29(4):61, 10 pages.

Hauser, K.K., et al., "Interactive Deformation Using Modal Analysis with Constraints", Proceedings of Graphics Interface, 2003, pp. 247-256.

Kou, X.Y., et al., "A systematic approach for Integrated Computer-Aided Design and Finite Element Analysis of Functionally-Graded-Material objects", Materials and Design, 2007, 28(10):2549-2565.

Luo, L., et al., "Chopper: Partitioning Models into 3D-Printable Parts", ACM Transactions on Graphics, 2012, 31(6):129, 9 pages.

Marsan, A.L., et al., "An Assessment of Data Requirements and Data Transfer Formats for Layered Manufacturing", National Institute of Standards and Technology, NISTIR 6216, Sep. 1998, 61 pages.

Nickell, R.E., "Nonlinear Dynamics by Mode Superposition", Computer Methods in Applied Mechanics and Engineering, 1976, 7(1):107-129.

Pentland, A., et al., "Good Vibrations: Modal Dynamics for Graphics and Animation", Computer Graphics, Jul. 1989, 23(3):215-222.

Stava, O., et al., "Stress Relief: Improving Structural Strength of 3D Printable Objects", ACM Transactions on Graphics, 2012, 31(4):48, 11 pages.

Telea, A., et al., "Voxel-Based Assessment of Printability of 3D Shapes", International Symposium on Mathematical Morphology and Its Applications to Signal and Image Processing, Jul. 2011, pp. 393-404.

Umetani, N., et al., "Guided Exploration of Physically Valid Shapes for Furniture Design", ACM Transactions on Graphics, 2012, 31(4):86, 12 pages.

Zeiler, T.A., "Matched Filter Concept and Maximum Gust Loads", Journal of Aircraft, Jan.-Feb. 1997, 34(1):101-108.

* cited by examiner y=yellow

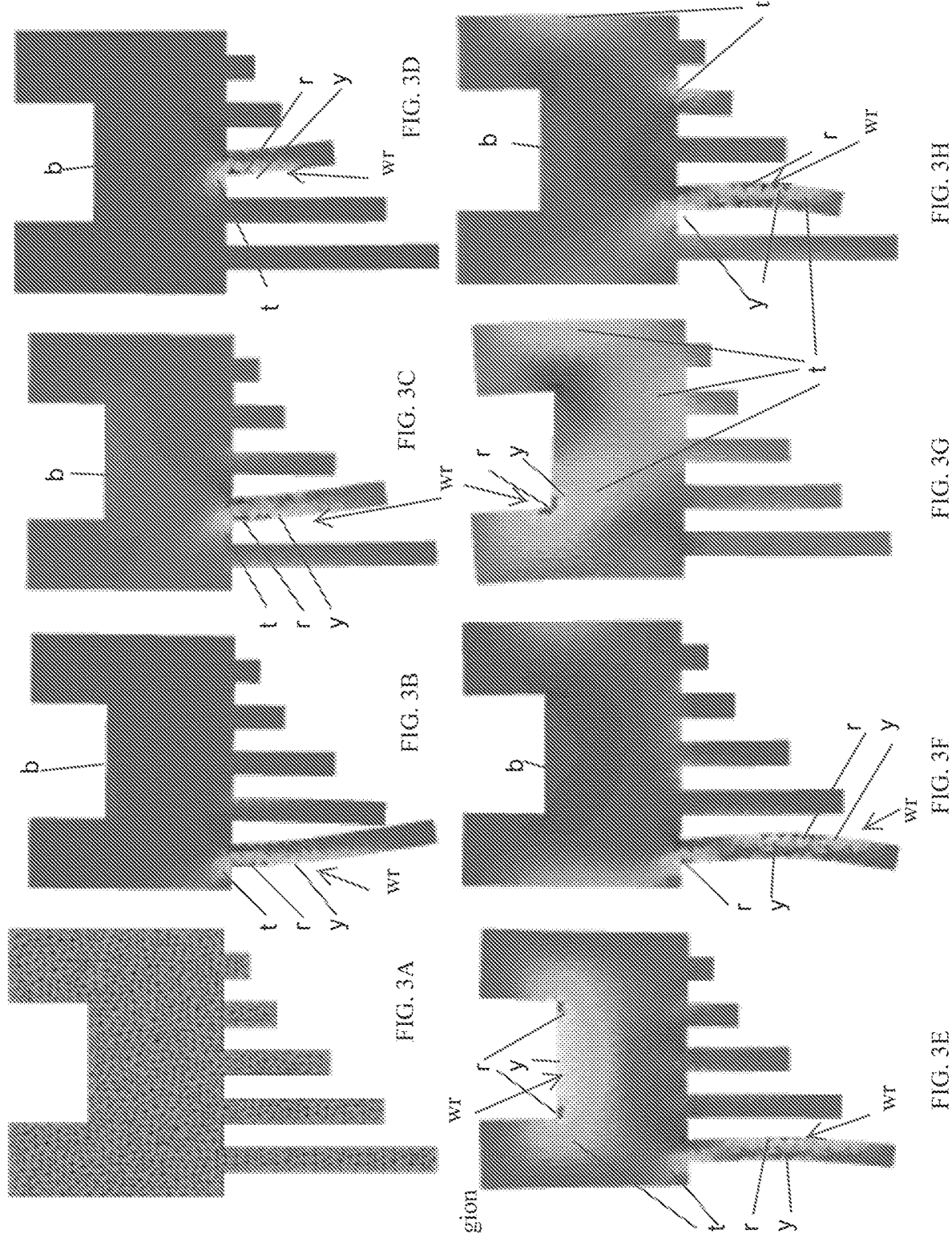

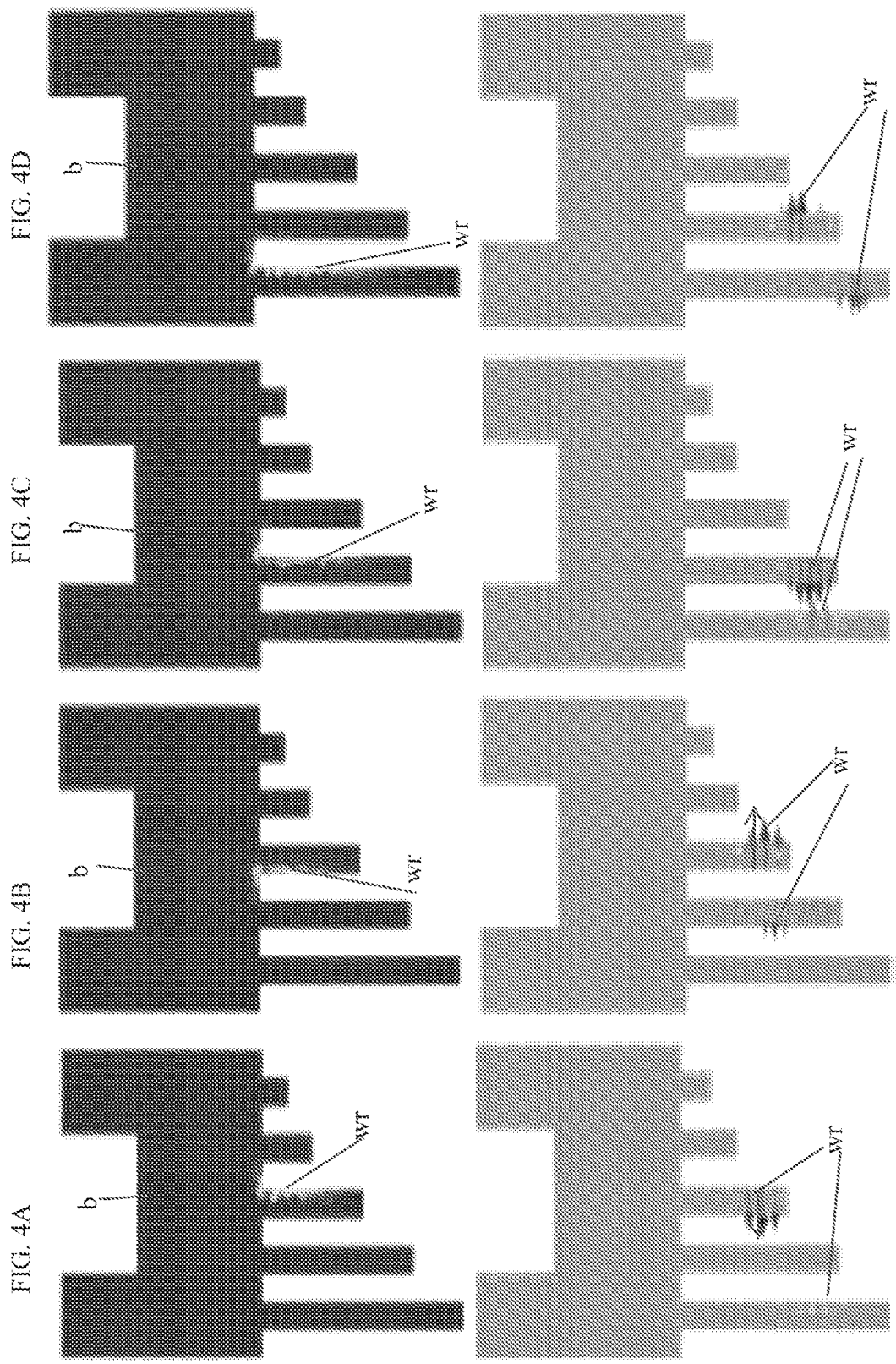

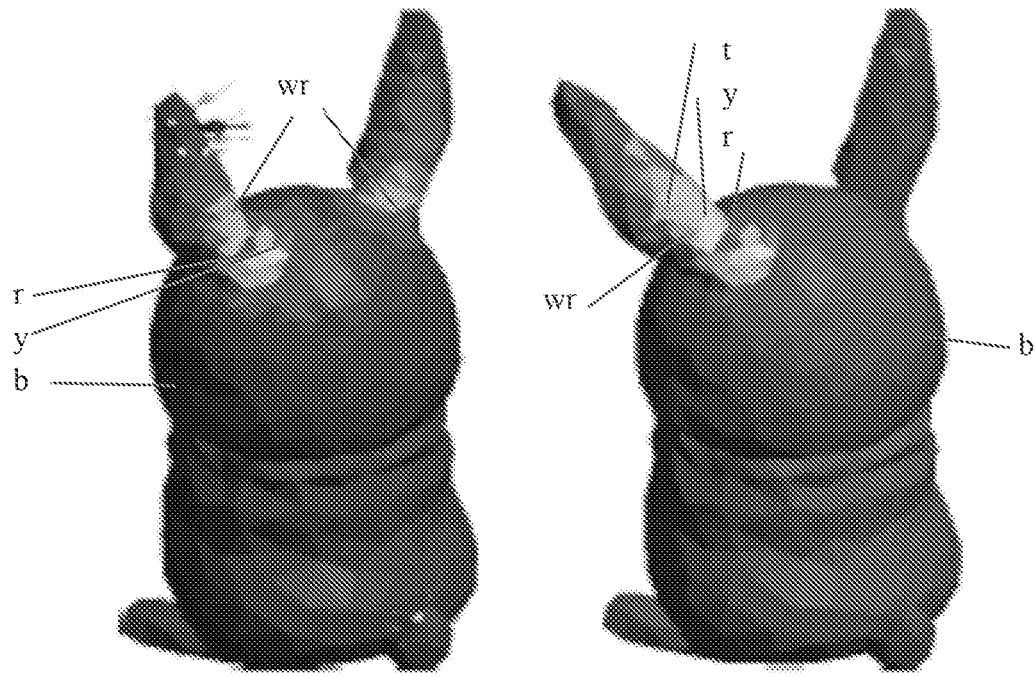
wr=weak region
r=red
b=blue
t=turquoise
y=yellow
FIG. 5B
FIG. 5A
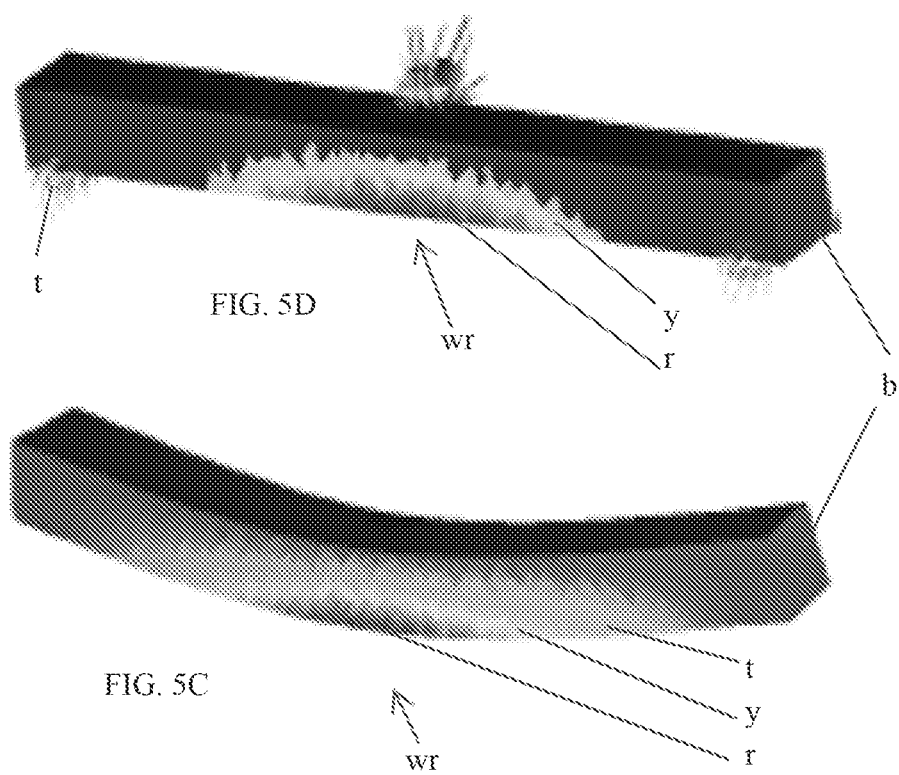
FIG. 5D
FIG. 5C

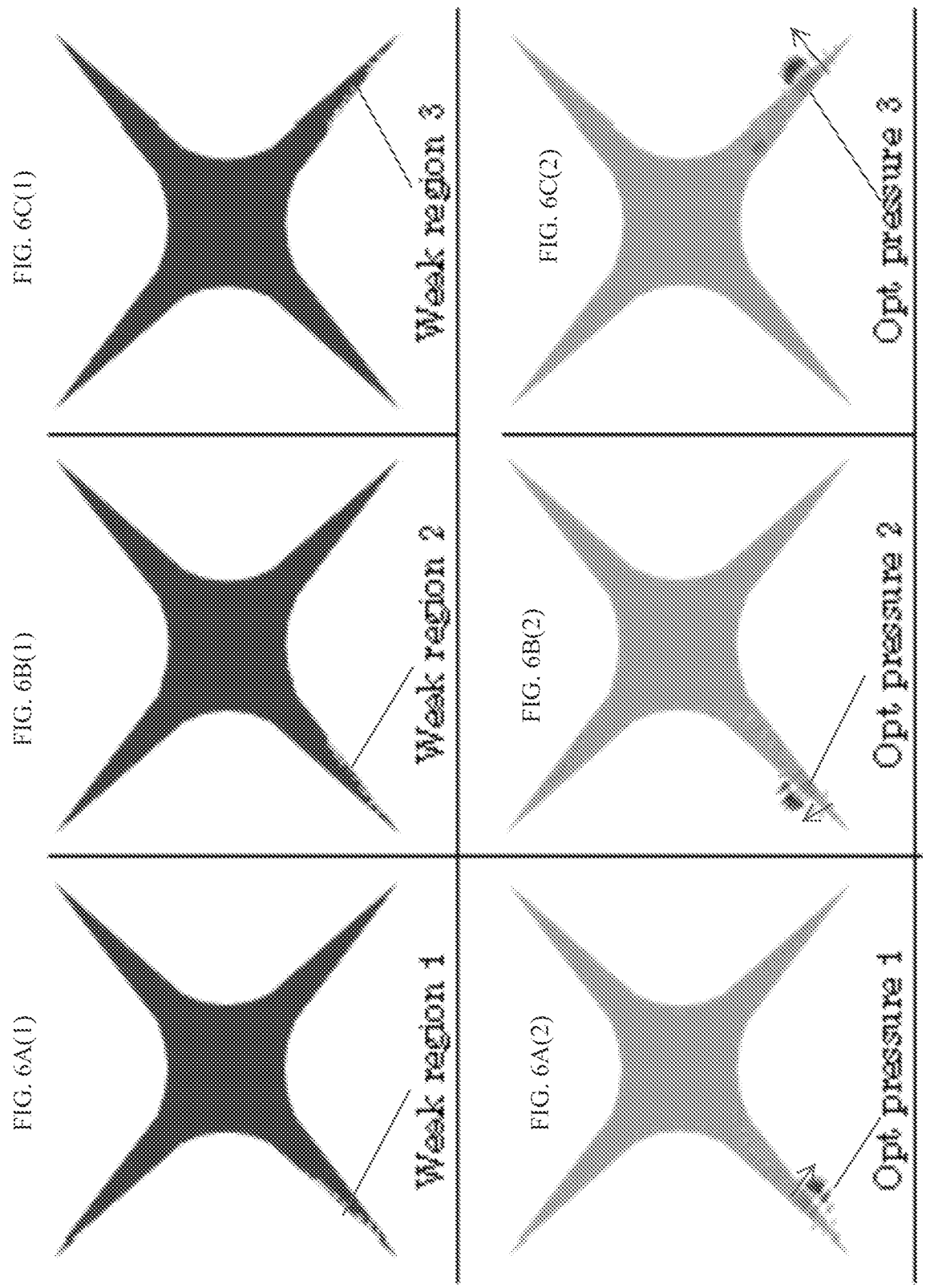

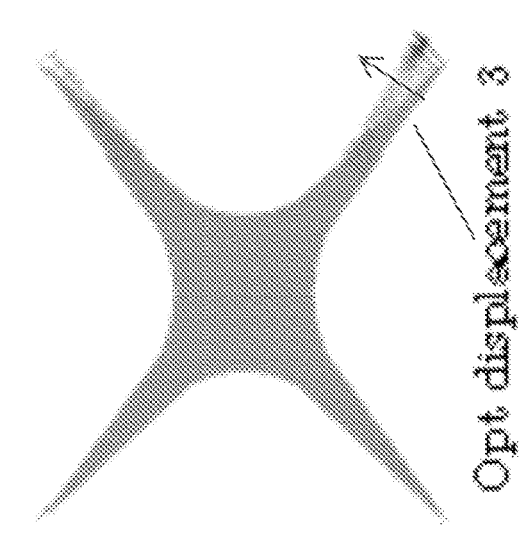
FIG. 6A(3)  Opt displacement 1
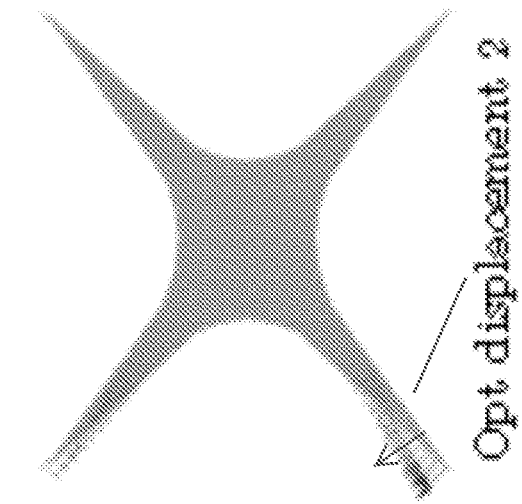
FIG. 6B(3)  Opt displacement 2
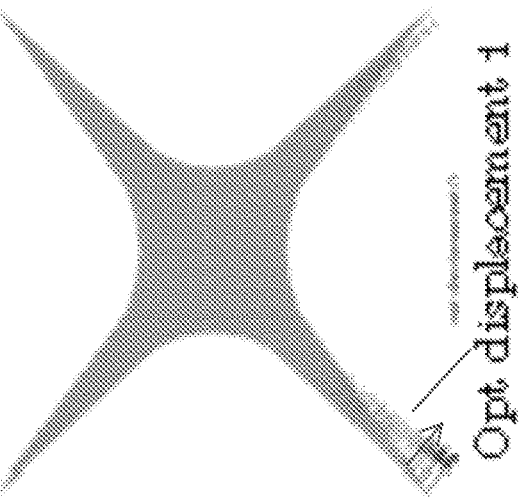
FIG. 6C(3)  Opt displacement 3
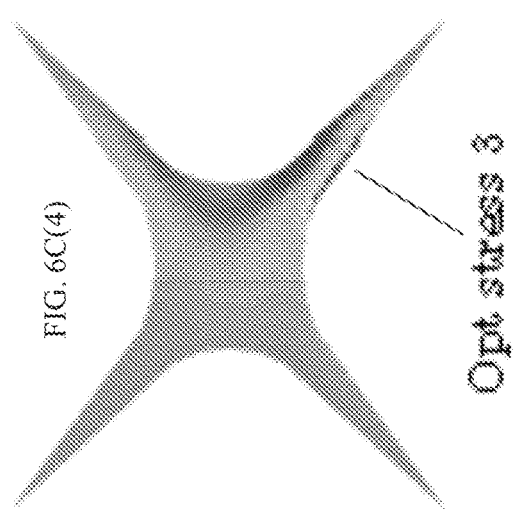
FIG. 6A(4)  Opt stress 1
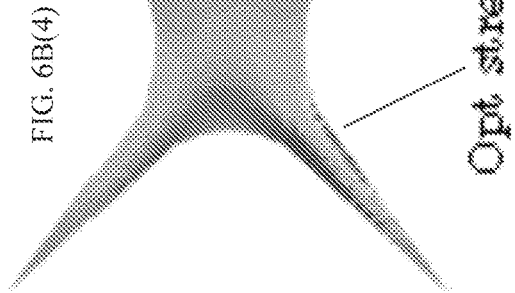
FIG. 6B(4)  Opt stress 2
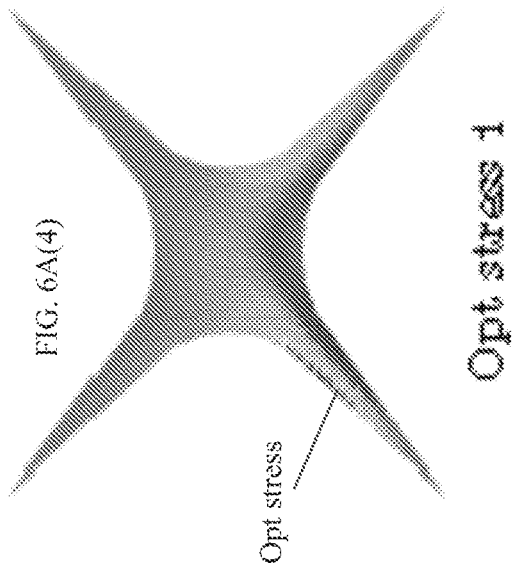
FIG. 6C(4)  Opt stress 3

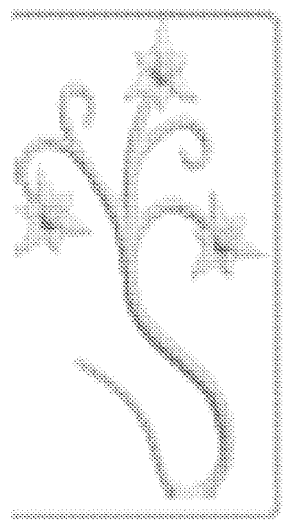
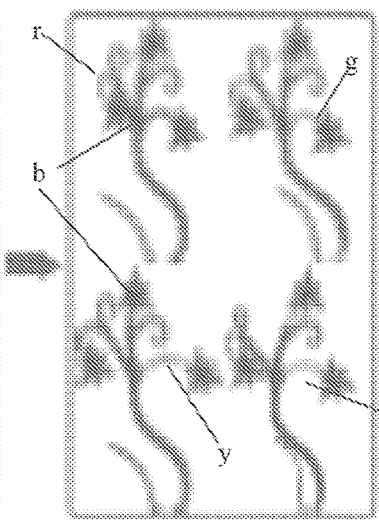
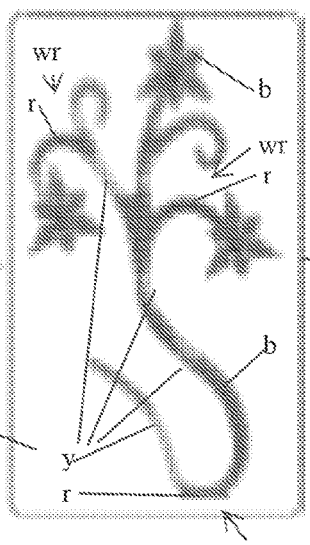
y=yellow
r=red
b=blue
g=green
FIG. 8A Input          FIG. 8B Modal Analysis          FIG. 8C Weak Region Extraction
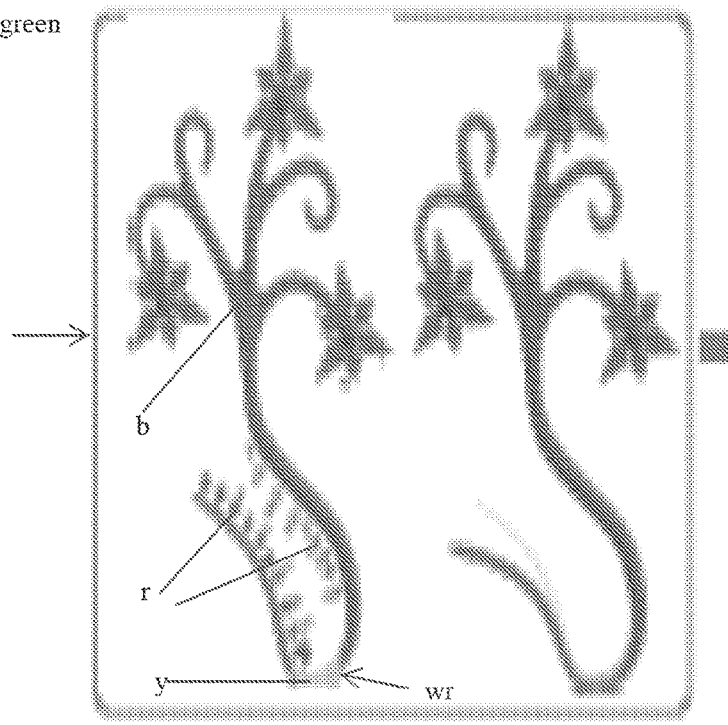
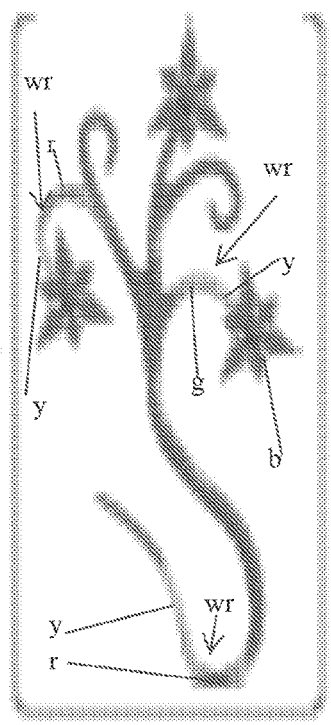
FIG. 8D Stress Optimization          FIG. 8E Weakness Map Y=yellow
r=red,
g=green
G=green
wr = weak region FIG. 14A(1)   FIG. 14B(1)   FIG. 14C(1)
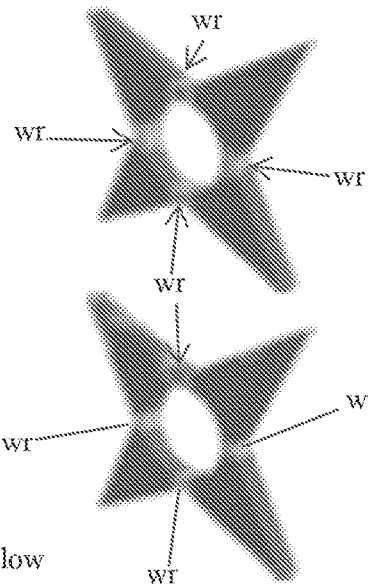 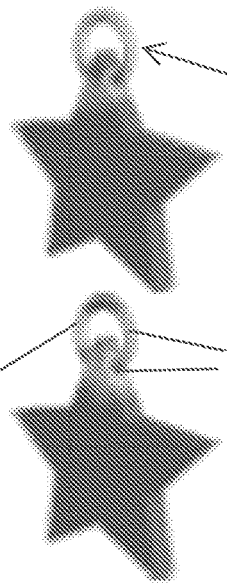 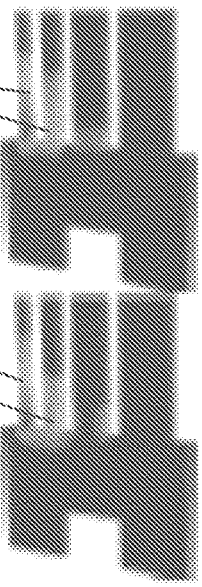
Y=yellow
r=red,
g=green
G=green
wr = weak region
FIG. 14A(2)   FIG. 14B(2)   FIG. 14C(2)
FIG. 15A   FIG. 15B   FIG. 15C
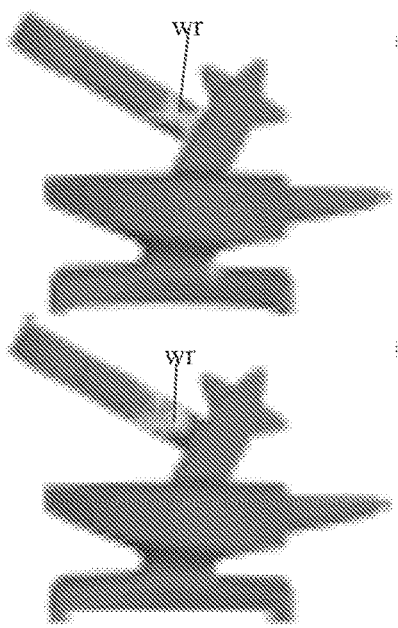 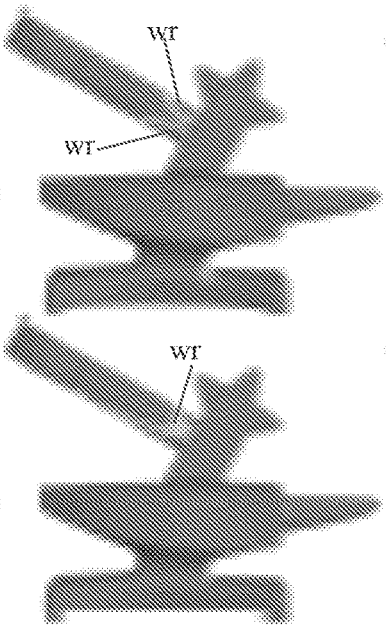 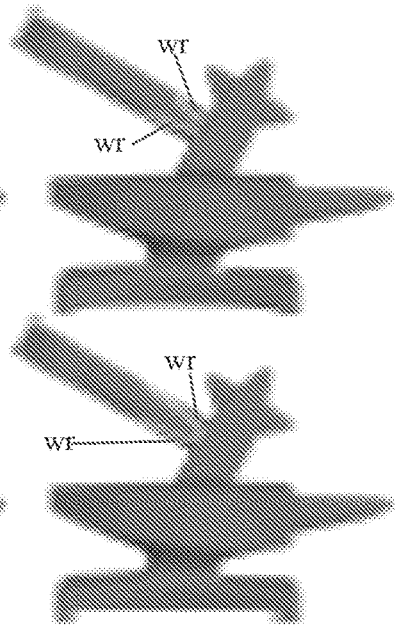
FIG. 15D   FIG. 15E   FIG. 15F

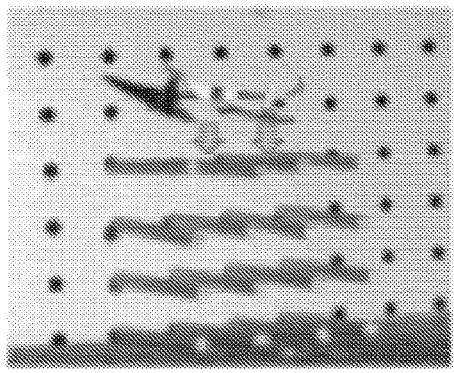
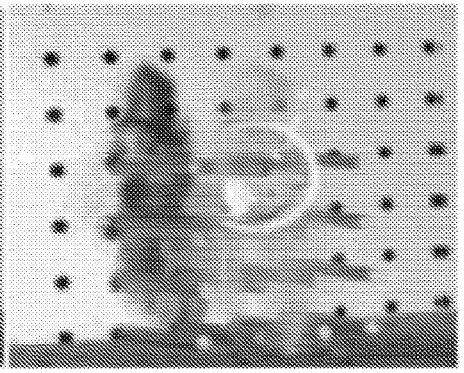
FIG. 16A　　　　　　　　FIG. 16B
 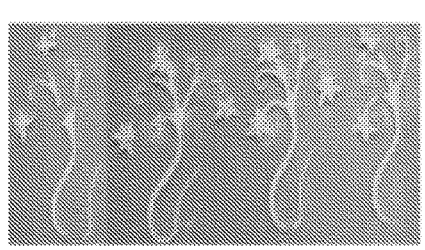　 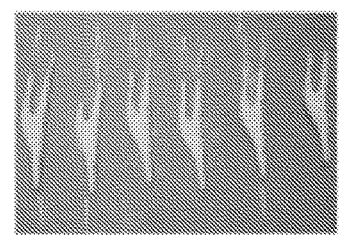
FIG. 17A　　　　　　　　FIG. 17B
 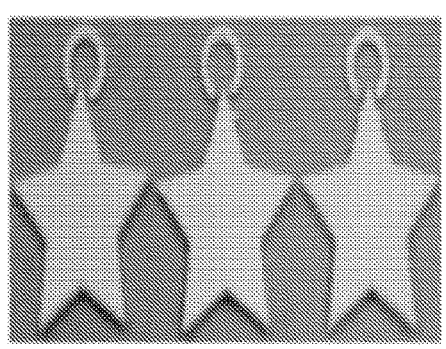　 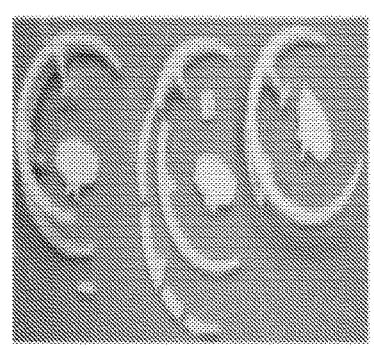
FIG. 17C
Y=yellow
r=red,
g=green
G=green
wr = weak region
FIG. 17D

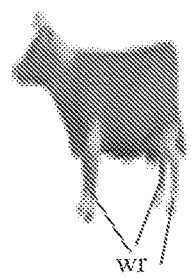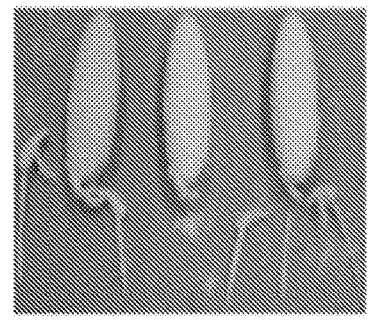
FIG. 17E
FIG. 17F
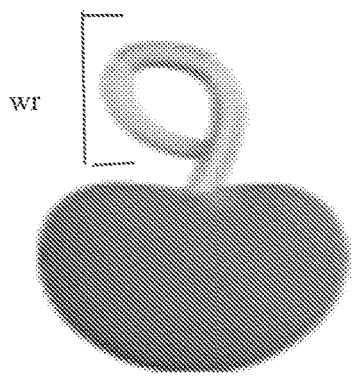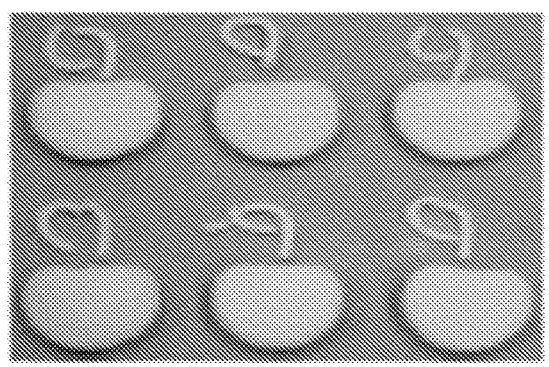
Y=yellow
r=red,
g=green
G=green
wr = weak region
FIG. 17G
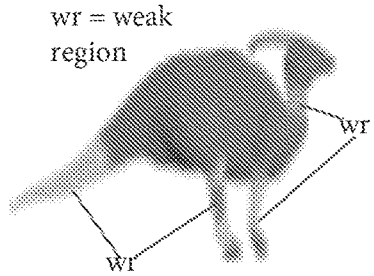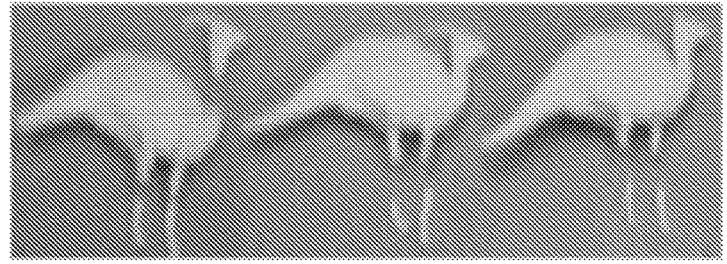
FIG. 17H

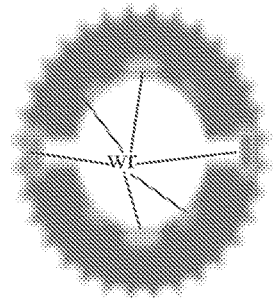 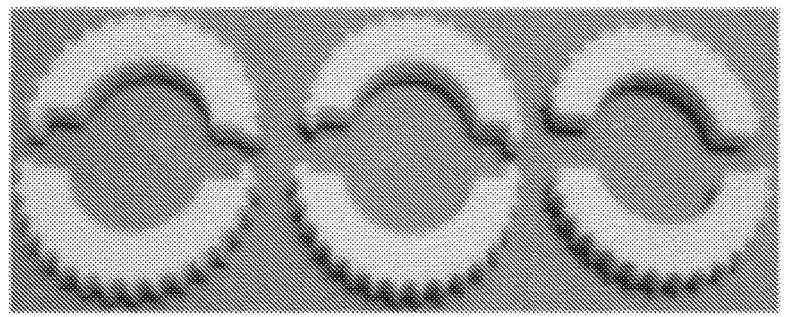
FIG. 17I
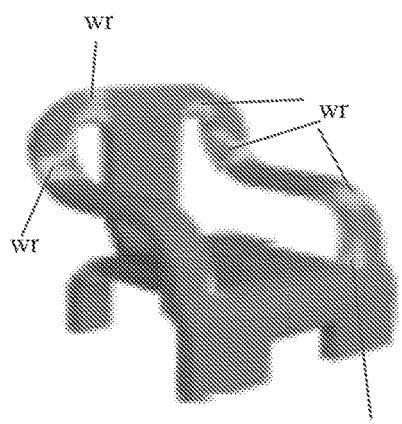 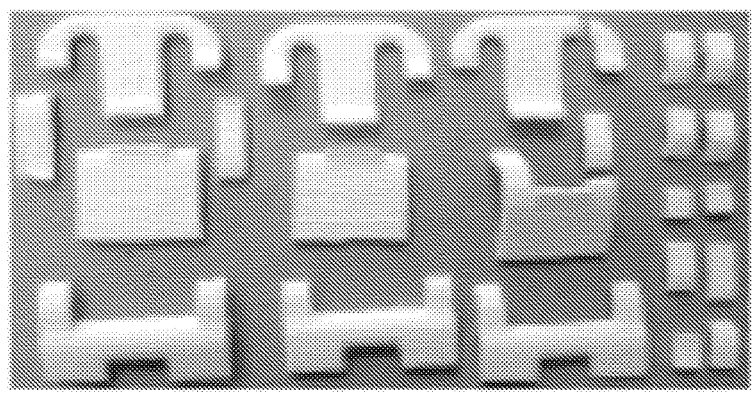
Y=yellow
r=red,
g=green
G=green
wr = weak region
FIG. 17J
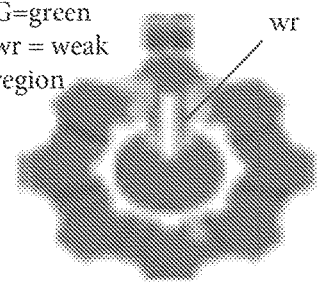 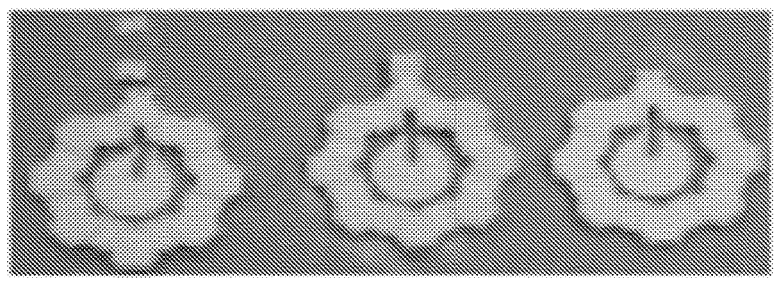
FIG. 17K Y=yellow
r=red,
g=green
G=green
wr = weak region

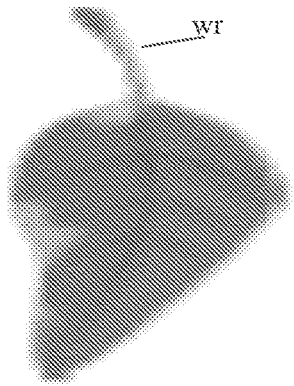 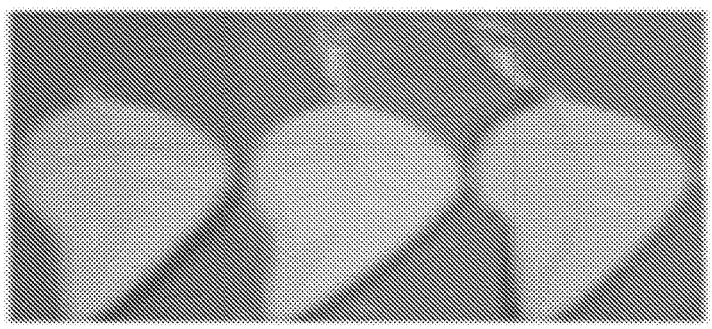
FIG. 17O
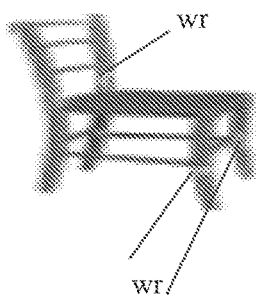 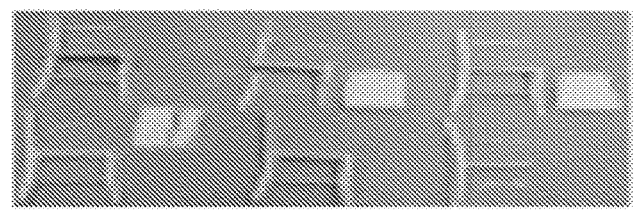
FIG. 17P
Y=yellow
r=red,
g=green
G=green
wr = weak region
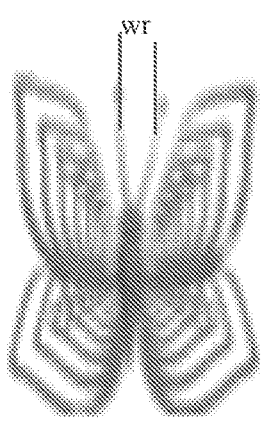 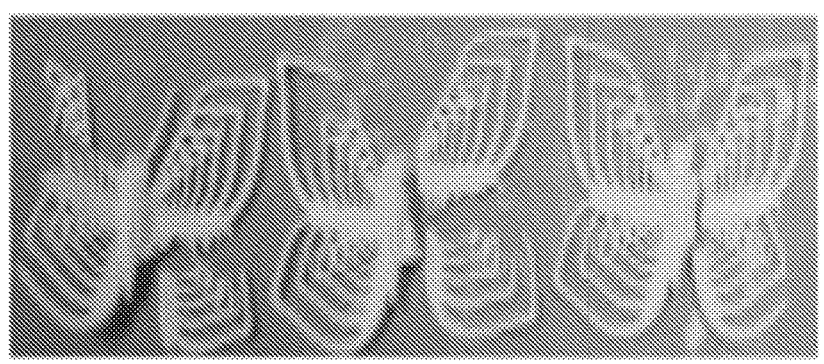
FIG. 17Q

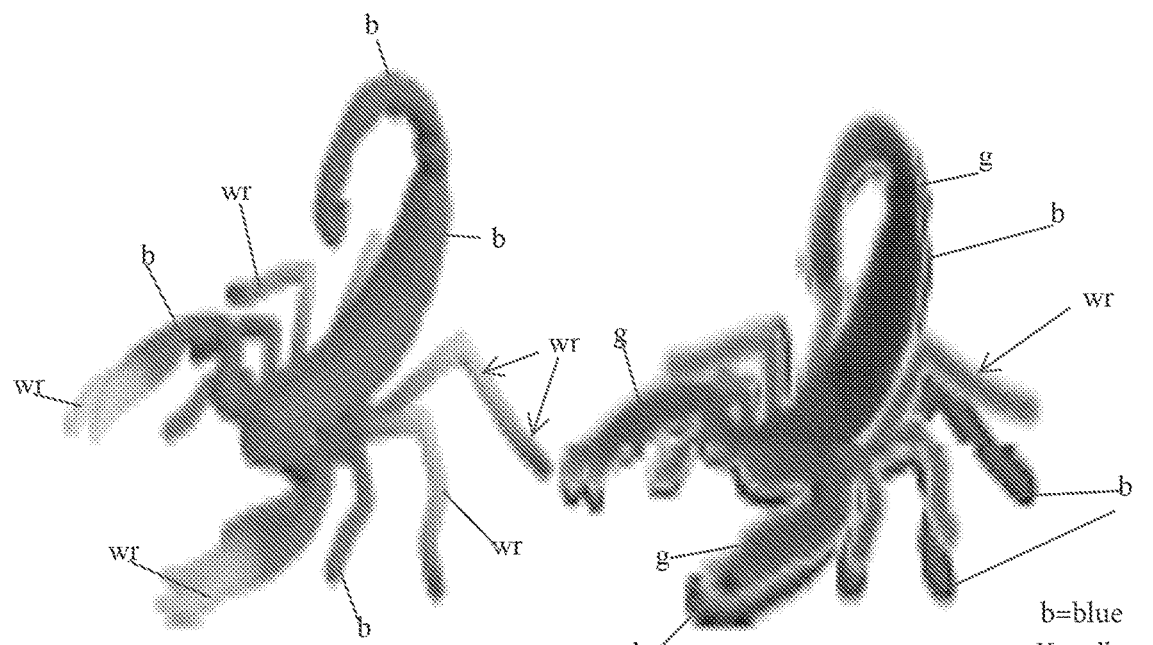
FIG 18A(1) FIG 18A(2)
b=blue
Y=yellow
r=red,
g=green
G=green
wr = weak region
FIG. 18B(1) FIG. 18B(2)
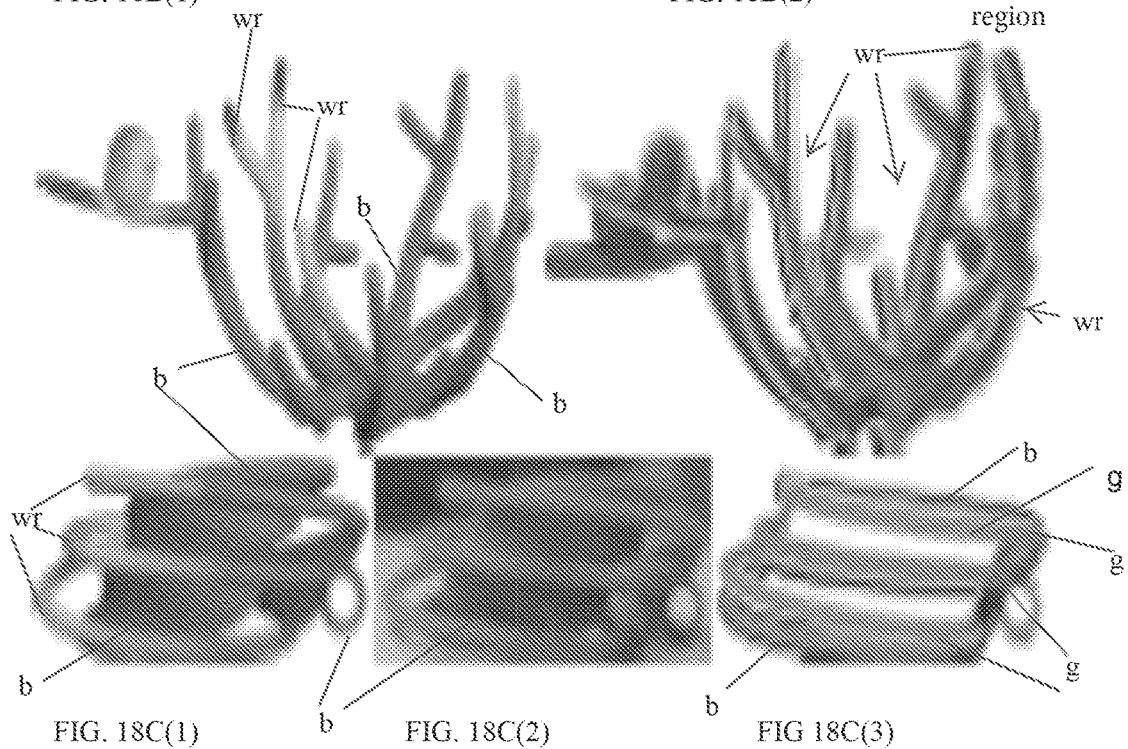
FIG. 18C(1)  FIG. 18C(2)  FIG 18C(3)

FIG. 19A
FIG. 19B
FIG. 19D
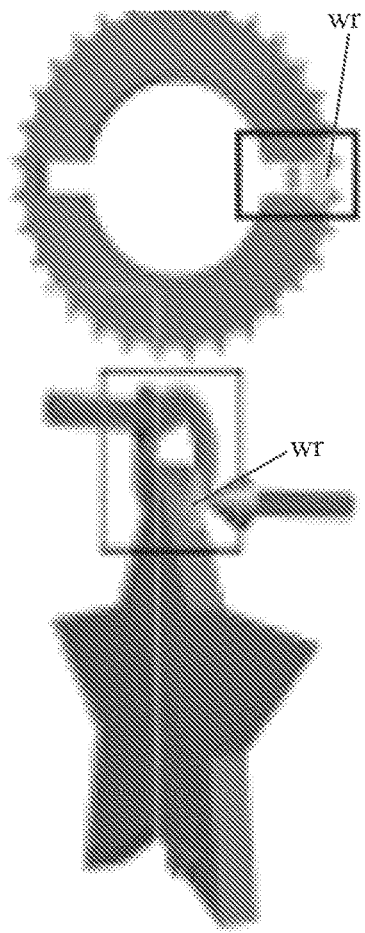
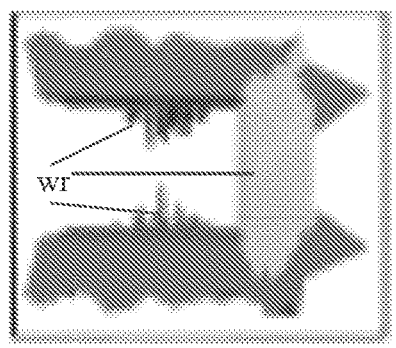
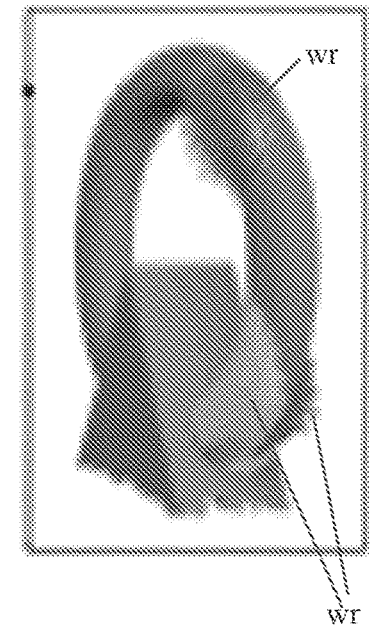
FIG. 19C
FIG. 19E
Y=yellow
r=red,
g=green
G=green
wr = weak region FIG. 20A    FIG. 20B(1)
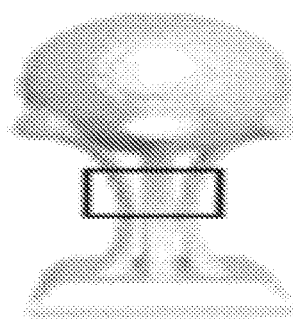
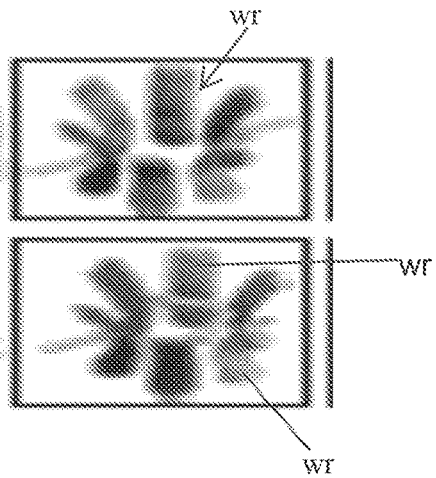
Y=yellow
r=red,
g=green
G=green
wr = weak region
FIG. 20B(2)
FIG. 20C(1)                    FIG. 20D(1)
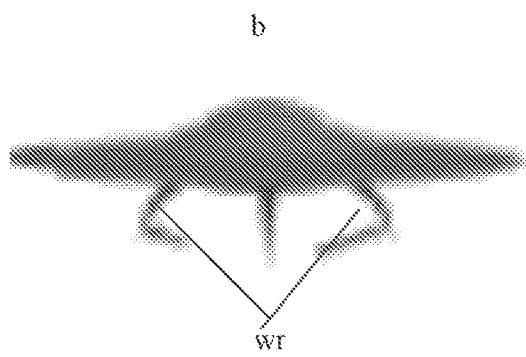
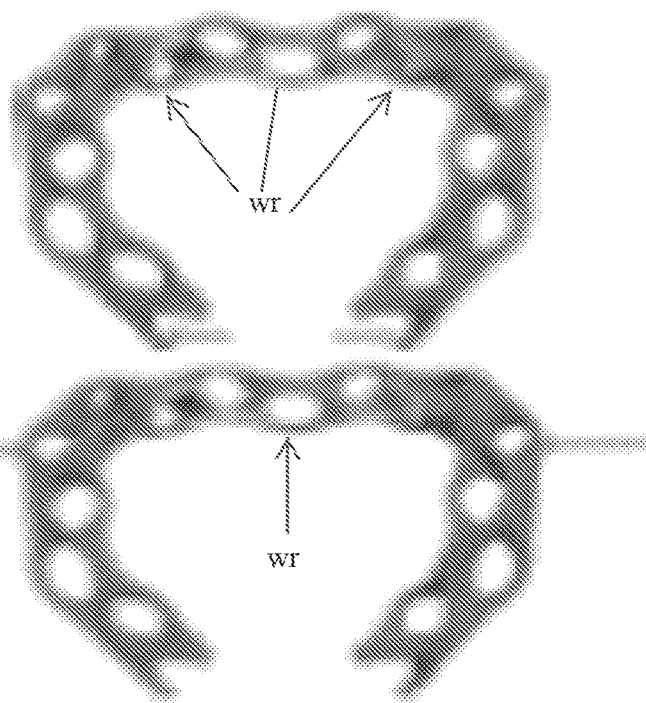
FIG. 20C(2)                    FIG. 20D(2)

FIG. 21A
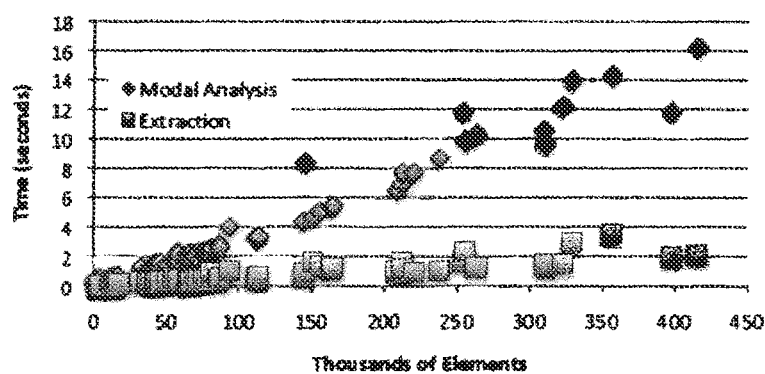
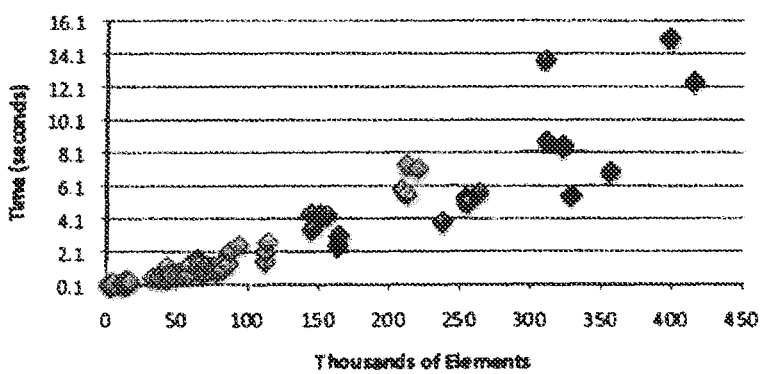
FIG. 21B

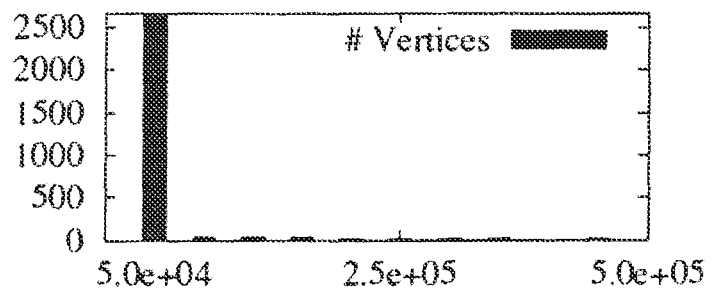
FIG. 22
FIG. 23A
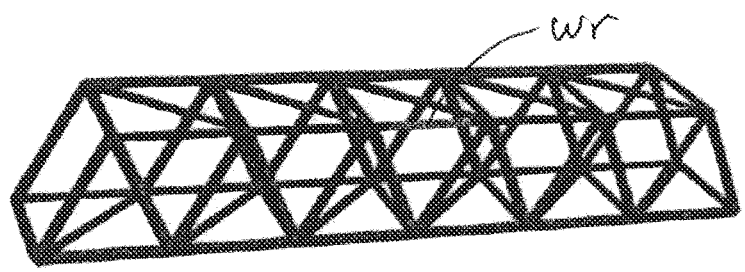
FIG. 23B
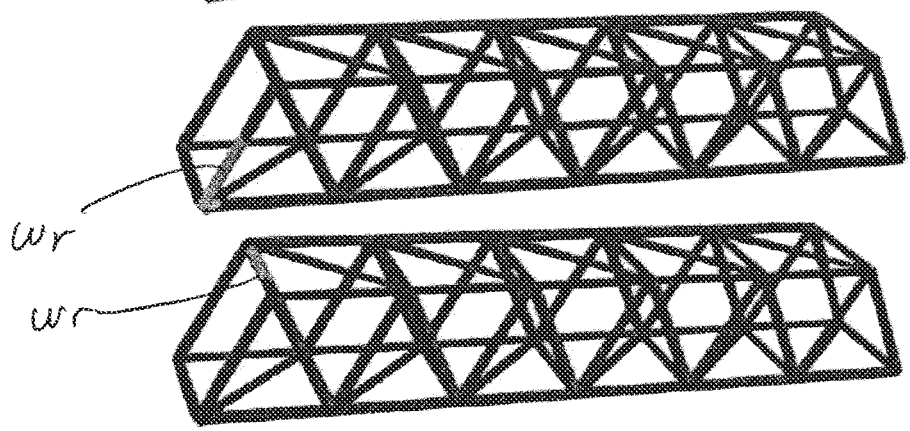
FIG. 23C
Y=yellow
r=red,
g=green
G=green
wr = weak region

STRUCTURAL WEAK SPOT ANALYSIS

CROSS-REFERENCE TO RELATED APPLICATIONS

This application is a 371 National Stage of PCT Patent Application No. PCT/US2013/066439, filed Oct. 23, 2013, which claims the priority to U.S. Provisional Application No. 61/855,989,filed May 29, 2013, and U.S. Provisional Patent Application No. 61/718,129, filed Oct. 24, 2012. The entire contents of these applications are hereby incorporated by reference in their entirety.

STATEMENT OF GOVERNMENTAL INTERESTS

The United States Government claims certain rights in the invention pursuant to NSF Grant IIS-0,905,502.

FIELD OF THE INVENTION

This invention is directed to a method and system for weak spot and also structural analysis of a shape or object. More particularly, the invention is directed to a method and system for use in commercial applications wherein mechanical stresses and strains can lead to endurance limit problems and system failure for a selected shape (object) and/or a material, such as for printing processes or any cyclic process that creates a work piece subject to mechanical forces. Further, the invention relates to a method and system for use in commercial applications wherein structural problems in objects are characterized for manufacture or for 3D printing based on geometry and material properties in particular and without making specific assumptions based on loads or manual load setup.

BACKGROUND OF THE INVENTION

In traditional engineering analyses a typical goal is to determine if stresses in an object or system are within bounds permissible for the material and/or the shape, typically well below the yield stress which is the point beyond which the material undergoes deformation and does not return to its original shape upon release of a load on the material.

Engineering analysis protocols typically assume that an engineer should determine realistic static or dynamic loads on a material part or structure. For example, an engine part typically repeats the same cyclic motion, with a known range of forces applied in a particular way. The loads on a piece of furniture or on a building are even more predictable, and, in the latter case, test loads are often codified. In general this approach and complemented by prototype testing, this methodology works well in mass-production, construction, and small-volume construction of complex machinery (e.g., ships and airplanes). This approach however is known to fail in some instances: for example, a well-known example is of the Citigroup Center building which had to be retrofitted because it was not tested for 45-degree wind loads at the design stage. This illustrates a limitation of testing with a set of predefined test loads. 3D printing applications typically follow a different operational path. Unlike conventional manufacturing methods, 3D printing is primarily used to produce unique or highly customized objects. In a typical scenario, a printing company for such processes will receive a large volume of uploads per day. In order to keep production times and costs down, the company must evaluate whether a design is structurally sound; this needs to be done in a rapid and inexpensive way but often without specific knowledge of design function and likely load distribution. In most cases, it is no longer possible to amortize the expense of engineering analysis by an expert to understand the semantic and plausible loads of each printed object by using standard engineering analysis software.

Computational analysis of structural soundness of mechanical parts and buildings is broadly used, but almost always in the context of known sets of loads. While engineers routinely need to evaluate soundness of structures and mechanisms under worst-case scenarios, in most cases, worst-case loads are designed empirically for specific problems (e.g., construction of buildings to withstand loads from flooding or earthquakes). Automatic methods are less common: an important set of methods in the context of modeling under uncertainty is based on the idea of anti-optimization.

In aerospace engineering, filter-based methods were developed to predict worst-case gusts and turbulence encountered by an airplane describes a model the aircraft's response to turbulence as a linear filter's response to Gaussian white noise. From this model, a worst-case noise sample and resulting strain are obtained.

Three-dimensional (3D) printing and other types of direct digital manufacturing are rapidly expanding industries that provide easy ways to manufacture highly customized and unique products. The development pipeline for such products is radically different from the conventional manufacturing pipeline: 3D geometric models are designed by users often with little or no manufacturing experience, and sent directly to the printer. Structural analysis on the user side with conventional tools is often unfeasible as it requires specialized training and software. Trial-and-error, the most common approach, is time consuming and expensive.

In the context of analysis tailored for 3D printing applications of the type considered herein, current methods evaluate 3D shapes in two main scenarios to discover structure weakness: applying gravity loads and gripping the shape using two fingers at locations predicted by a heuristic method. This set of fixed usage scenarios is often insufficient to expose the true structure weakness for many printed shapes. Other methods focus on purely geometric ways to evaluate whether a structure is suitable for 3D printing based on empirical rules formulated by the 3D printing industry.

In yet another area, structural stability for simple furniture constructed from rigid planks connected by nails is analyzed at interactive rates. These methods also suggest corrections when shapes with poor stability are detected.

Other recent works address various aspects of computational design for 3D printing. One method provides a pipeline to print objects in a composite material that reproduces desired deformation behavior. To achieve this goal, accurate modeling is done of the nonlinear stress-strain relationship of printing materials and how printed models will respond to imposed loads. The space of deformations is a user-supplied input, and structural soundness of the design with respect to other loads is not considered. While some specialized work on CAD for 3D printing exists, overwhelmingly, standard tools with no or little analysis support are used.

Other work proposes a framework to decompose 3D shapes into smaller parts that can be assembled without compromising the physical functionality of the shape so that larger objects can be printed using printers with a small working volume. A standard finite element simulation to estimate stress of the input shape under gravity in a user specified upright orientation. Other works aim to print articulated models that maintain poses under gravity but do not require manual assembly designs and fits a generic, parametrized printable joint template based on a ball and socket joint. The joint provides enough internal friction and strength to hold poses and survive manipulation, but is tuned to its parameters experimentally instead of using a physically based optimization. Other designs a similar ball and socket joint and a hinge joint. An approximate geometric optimization of stresses is performed by maximizing certain cross-sectional areas of the joint.

3D printing has also been used to reproduce appearance to optimize the layering of base materials in a 3D multi-material printer to print objects whose subsurface scattering best matches an input BSSRDF.

Common single-stage 3D printing processes either deposit the liquid material only in needed places (e.g., FDM) or deposit material in powder form layer by layer, and then fuse or harden it at points inside the object (e.g., stereo-lithography uses photosensistive polymers, and laser sintering fuses regular polymers by heat).

These processes typically use flexible polymers with large elastic and plastic zones in their stress-strain curves. These polymers rarely break if geometric criteria for printability are satisfied, but they can undergo large plastic deformations.

Printing metal, ceramics, and composite materials often involves multiple stages. For example, the object may be printed layer by layer in metal powder with polymer binder. At the next stage, the binder is cured in a furnace, resulting in a green state part, and at the last stage, the metal is fused in a furnace and extra metal is added. Green state is brittle and has low strength, so parts in this state easily damaged. A simpler multistage process is used for relatively brittle composite materials, e.g, gypsum-based multicolor materials; a second curing stage is used to give the material additional strength. Both the green state and the final material are relatively brittle. Whenever binding polymer is mixed layer-by-layer with a different material, resulting material is likely to be highly anisotropic.

Therefore, both brittle and ductile materials are of importance. The former requires predicting where the material is likely to break, and the latter requires predicting extreme deformations likely to become plastic. Due to the layer-by-layer nature of the printing process, anisotropy is common and needs to be taken into account. Some of the loads even during production stages are hard to predict and quantify.

Consequently, it is desirable to design a system and method capable of automatically identifying "worst case" load scenarios, and evaluating possible stresses under various conditions for a system. A fully automatic system of this type would preferably require as input variables only a knowledge of the shape of the object or material of the system under load, total maximal surface forces applied, and allowed stress ranges. From these input variables, the system would then determine possible ways to distribute the load on the surface of the object or material to achieve maximal stresses, and determine if any of these stresses are outside a safe range. Alternatively, for a given maximal stress, the system would determine a distribution of loads producing this stress with minimal total force applied. It is further desirable to design a system and method capable of identifying "worst case" structural problems in objects, particularly for 3D printing, based only on a knowledge of the shape or geometry of the object or material of the system and material properties only, with no specific assumptions made about loads and manual load setups.

SUMMARY OF THE INVENTION

In one embodiment, the present invention combines the basic assumptions set forth above with heuristics allowing us to provide a computationally feasible method and system. In this embodiment of invention the following analyses are preferably utilized:

(a) The high stress in most "bad" cases (i.e. load configurations that require minimal force to exceed a limit) tend to be concentrated in relatively small parts of the object ("weak" regions); (b) weak regions ("wr") can be identified by modal analysis, i.e. artificial "shaking" of the object at its natural frequencies; and (c) once weak regions are isolated, the problem of determining load distributions which maximize stress at a specific weak region can be approximated by a convex optimization problem evaluation (or even a linear programming problem evaluation), for which a solution is unique and reliable solution method tools are available in the art.

In a preferred methodology, the process can be roughly divided into four steps: preprocessing, modal analysis, weak region extraction and stress optimization. The preprocessing step can be done in a variety of ways, and potentially can be eliminated entirely in selected embodiments.

In its current form the method has certain limitations which can be recognized and engineering applications can be adjusted and safe limits established while still applying the method and system effectively. Weaker region detection appears to work well for a broad range of examples, but it is ultimately a heuristic method. Additional heuristics may be needed to provide more comprehensive coverage. Computing multiple modes can be costly (although it can be reasonably easily performed in parallel). Complex object shapes and sizes may require many modes before all weak regions are found. More generally, the mathematical definition of a weak region can to be refined to agree better with basic engineering evaluation and projections: some stress distributions are known to be more dangerous than others, and more likely to lead to fracture (e.g., compressive vs. extensional stress is not distinguished at this point).

In yet another embodiment of the invention, a method and system has been developed that identifies structural problems in objects designed for 3D printing based on geometry and material properties only, without specific assumptions on loads and manual load setup. The problem is formulated as a constrained optimization problem to determine the "worst" load distribution for a shape that will cause high local stress or large deformations. While in its general form this optimization has a very high computational cost even for relatively small models, an efficient heuristic is demonstrated based on modal analysis and an approximation is provided by a linear programming problem that can solve the problem quickly for the typical size of printed models. The method is validated both computationally and experimentally and demonstrate that it has good predictive power for a number of diverse 3D printed shapes.

In this embodiment, a method and system is therefore provided for approximating the solution of the following problem: From the shape of an object and its material properties, determine the easiest (in terms of minimal applied force) ways to break it.

In order to understand the nature of the invention it is useful to consider the reasons why a suitable 3D model cannot be manufactured by current methods or is likely to fail:

(1) the dimensions of thin features (walls, cylinder-like features, etc.) are too small for the printing process, resulting in shape fragmentation at the printing stage;
(2) the strength of the shape is not high enough to withstand gravity, at one of the stages of the printing process;
(3) the printed shape is likely to be damaged during routine handling during the printing process or shipment;
(4) the shape breaks during routine use.

In most cases, the first problem is addressed by simple geometric rules in a known way and the second is a straightforward direct simulation problem. The instant invention focus is on the other remaining two problems of the sequence. On the one hand, many 3D printed objects are manufactured with a specific mechanical role in mind, and full evaluation is possible only if sufficient information on expected loads is available. On the other hand, jewelry, toys, art pieces, various types of clothing, and gadget accessories account for a large fraction of products shipped by 3D printing service providers. These objects are often expected to withstand a variety of poorly defined loads (picking up, accidental bending or dropping, forces during shipping, etc.).

To be able to predict structural soundness of a printed object, worst-case loads are sought, within a suitably constrained family, that are most likely to result in damage or undesirable deformations. A direct formulation results in difficult nonlinear and nonconvex optimization problems has been developed with PDF constraints. An approximate method for this search, reducing it to an eigenproblem and a sequence of linear programming problems. The method preferably relies on using eigenmodes of the shape. Modal analysis has proven useful in many contexts. The use of Laplacian eigenmodes of simple shapes for computation predates computers and has a long history in model order reduction for a variety of applications including nonlinear elasticity. In graphics literature, first introduced eigenmodes as a basis suitable for simulation applications, and more recently, a number of deformation-related algorithms based on eigenmode bases have been proposed. At the same time, experimental modal analysis (applying periodic forces with different frequencies and measuring displacements at various points) is broadly used to detect structural damage.

The foregoing summary is illustrative only and is not intended to be in any way limiting. In addition to the illustrative aspects, embodiments, and features described above, further aspects, embodiments, and features will become apparent by reference to the following drawings and the detailed description. These and other objects, advantages and features of the invention, together with the organization and manner of operation therefore, will become apparent from the following detailed description where taken in conjunction with the accompanying drawings wherein like elements have like numerals throughout the several drawings described below.

The foregoing and other features of the present disclosure will become more fully apparent from the following description and appended claims, taken in conjunction with the accompanying drawings described hereinbelow. Understanding that these drawings depict only several embodiments in accordance with the disclosure and are, therefore, not to be considered limiting of its scope, the disclosure will be described with additional specificity and detail through use of the accompanying drawings.

BRIEF DESCRIPTION OF THE DRAWINGS

In one embodiment of the invention.

FIG. 3A shows a test shape and FIGS. 3B-3H show the first seven modes of the test shape;

FIGS. 4A-4D show the first four test regions extracted from a sample shape with the non-blue regions corresponding to weak regions ("wr"); FIGS. 4E-4H show optimized pressure distributions to maximize stress at corresponding weak regions;

FIG. 5A shows a weak region of a first sample and FIG. 5B shows the corresponding pressure distribution at the weak region; FIG. 5C shows a weak region of a second sample and FIG. 5D shows the corresponding pressure distribution at the weak region (note the original displacement that induces maximum stress is also shown at the weak region); and FIG. 6A(1) shows a weak region 1 of another sample and FIGS. 6A(2)-6A(4) shows optimum pressure, optimum displacement and optimum stress for the weak region 1; FIG. 6B(1) shows a weak region 2 of the star and FIGS. 6B(2)-6B(4) show optimum pressure, optimum displacement and optimum stress for the weak region 2; FIG. 6C(1) shows a weak region 2 of the star and FIGS. 6C(2)-6C(4) show optimum pressure, optimum displacement and optimum stress of the weak region 3;

In another embodiment of the invention, FIGS. 8A-8E illustrate an overview of steps of determining weak spots in an object with FIG. 8A being an input state, FIG. 8B is a modal analysis state, FIG. 8C is a weak region extraction state, FIG. 8D is a stress optimization state and FIG. 8E is a weakness map output state;

FIGS. 14A(1)-14A(2) show comparison of similar optimum stresses by brute force and weak region analysis; FIGS. 14B(1) and 1Bb(2) show the same comparison as in FIGS. 14a(1) and 14a(2) but for another object and FIGS. 14C(1) and 14C(2) the same comparison as in 14A(1) and 14A(2) but for a different object;

FIGS. 15(a)-15(f) show various different mesh solutions with vertex counts of 7K, 17K, 30K, 38K, 53K and 57K and which algorithm output generates consistent weakness maps;

FIGS. 16A and 16B illustrate one example of models printed in green state "sandstone" for a drop test wherein testing models are covered with loose powder layers which shake off an impact (see dust in FIG. 16B);

FIGS. 18A(1) and 18A(2) show one object with a comparison of predicted deformation likelihood to true deformation, respectively; FIGS. 18B(1) and 18B(2) for another object; and 18C(1) and 18C(2) yet another object wherein the red or "r" region being most likely, FIGS. 18A(2), 18B(2) and 18C(2) having deformed 3D printing models in green or "g" overlaid on blue or "b"; for 18C(1) and 18C(3) the center of the ring enables highlighting deformation; and 18C(2) is for a full undeformed model;

FIGS. 19A-19E show models pinch grips which cannot generate worst-case loads and arrows of FIG. 19A indicate a total force and torque summing to zero;

FIG. 20A shows an overall image of an object, FIGS. 20B(1) and 20B(2) show analysis for the instant invention versus a conventional prior art method, respectively, for one object; FIGS. 20C(1) and 20C(2) show results for a second object and FIGS. 20D(1) and 20D(2) show results for a third object;

FIG. 21A shows a plot of model analysis and extraction for a weak region computation time with number of tetrahedral (the abscissa axis); FIG. 21B shows a plot of average cost of setting up and running a linear program for each weak region;

FIG. 22 shows a histogram model vertex counts;

FIGS. 23A-23C show different ratios of directional Young moduli leading to weakest regions wherein FIG. 23A show results of stimulating a truss that is five times higher in the X, Y and Z direction, respectively;

DETAILED DESCRIPTION OF PREFERRED EMBODIMENTS

Figures 1A, 1B, 1C:
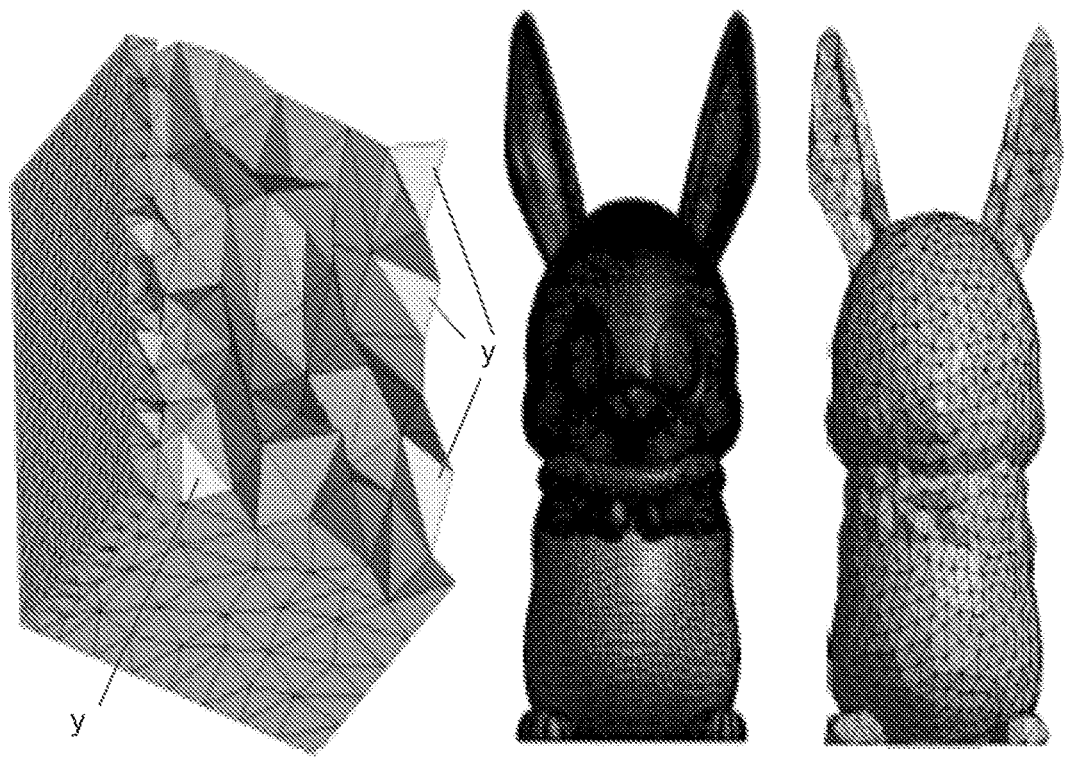
FIG. 1A shows a depiction of tetrahedral mesh produced from a polygon mesh keeps all input vertices in the output and would generate a large number of elements.
FIG. 1B shows a user input mesh of extremely high resolution and FIG. 1C shows an ACVD method output mesh with good quality triangles without introducing self-intersections.
Figures 2A, 2B:
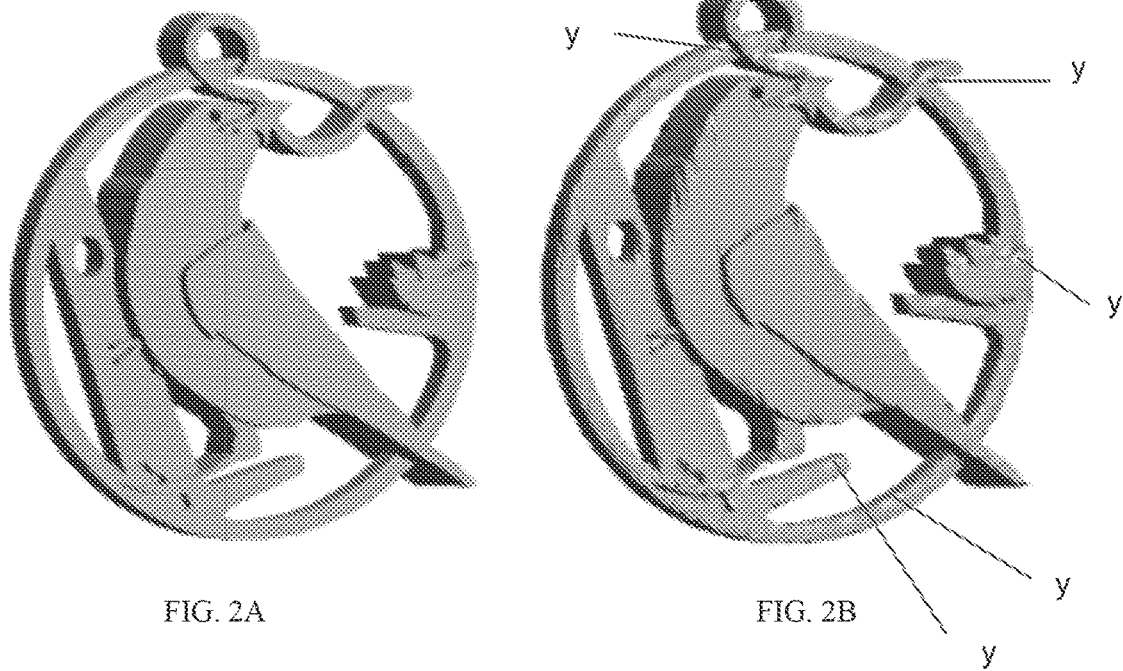
FIG. 2A shows sharp features of an original tetgen output result and FIG. 2B shows reduced resolution upon remeshing using the ACVD method.

In a preferred system and method of one embodiment of the invention, key elements include separating weak spot identification from determining "worst-case" loads; using a global method to identify multiple weak regions at the same time; and using a constrained surface load model to determine the weakness of each region. The actual choice of method for each step may vary. For the first step (weak region identification), a modal analysis is used, based on one of the elasticity discretizations described in detail hereinafter. This methodology computes deformations corresponding to global smoothly varying force distributions and areas of high stresses are identified as weak regions. One can use a purely geometric method, based on computing local thickness of an object using for example a medial axis decomposition, voxel erosion or any other such conventional technique. Modal analysis is a well-established technique used by engineers and architects for determining the structure response under vibration forces such as strong wind, earthquakes and other known nearly-periodic forces. The modal analysis can be performed using a finite element discretization on a polyhedral mesh conforming to the boundary of the object, a boundary element method, or a meshless discretization approach. With regard to the figures, red ("r") was the highest stress followed by the other colors and blue ("b") was lowest stress.

For the second step (determination of worst-case forces), different types of constrained force models can be used: in a preferred implementation positive forces are applied normal to the surface, with maximal per point magnitude and total load constrained. This models typical force behavior in handling and transporting 3D printed objects. One can also consider non-normal forces applied in arbitrary directions, impose further constraints on force density variation, and include volume forces such as gravity. As a target for optimization, different norms of the average, or maximal stress on the weak region can be used, such as von Mises stress, maximal principal stress and other conventional stresses known in the art. As an indicator of failure, various material-dependent yield strength, ultimate compressive and tensile strengths can be used. The application of the method is not restricted to the domain of 3D printing. The method and system can be used to predict structural strength/weakness for any object for which a CAD model (a surface mesh, a spline or subdivision-based boundary representation, a solid model represented by a CSG data structure, voxelized model, level set model or another 3D computer representation for which engineering analysis can be performed is available, and for which a typical load scenario is unknown.

Implementation of the invention is accomplished most readily by a computer system (stand alone or in the cloud) having a non-transitory memory to execute computer software implementing the various steps described throughout the application.

In one most preferred embodiment of this first embodiment, the methodology applies a preprocessing step to produce a tetrahedron mesh (called a "tet" mesh in the rest of this document). The starting point for tet mesh generation, for which a variety of techniques and software are available, is a triangle mesh bounding a region of spacec, which can be easily obtained from most common shape representations. Most tet mesh generation techniques add vertices in the interior of the triangle mesh and construct tetrahedra connecting these vertices. As many additional vertices may be needed in the interior to maintain good tet mesh quality, for large input triangle meshes the process may result in very large tet meshes. To keep the time and memory requirements of modal analysis and force optimization within a reasonable range, the triangle mesh may be simplified before the tet mesh is generated, using one of many available feature-preserving mesh simplification methods. (see FIG. 1A).

In a next step modal analysis carries out computations of natural frequencies and modal displacement of an input shape. With zero damping and zero external force, a shape deformed according to a modal displacement would vibrate indefinitely at the corresponding natural frequency.

In one example, FIG. 3A shows a test shape and FIGS. 3B-3H show the first seven modes of the given 2D shape of FIG. 3A. Based on basic engineering concepts and projections, the easiest way of breaking a shape is to bend the longest protruding feature, which is captured by the first dominant mode (see FIG. 3B) computed using modal analysis.

Modal analysis gives a sequence of distinct deformations (e.g. modal displacements) that are likely to capture common strong deformations experienced by objects, with no prior assumptions on loads. The modes with lowest eigenvalues require less energy to excite than modes with larger eigenvalues (assuming each modal displacement is normalized). For this reasons the low-eigenvalue modes are more common in our everyday life because the less prominent modes requires too much energy to start or its amplitude is too small to notice.

Modal displacement thus is important for revealing structural strength and weakness of a shape or object. The following sections describe how to exploit this information and determine whether a shape is sufficiently strong for 3D printing (or any other appropriate application involving the same issues for objects under stress and having "weak" regions).

In regard to weak region extraction, structural failures occur in regions where the stress exceeds the maximum stress that the material or shape could tolerate. This can depend on whether the material is brittle, and on its yield strength and/or ultimate tensile strength. The goal of this step is to use modal analysis results to identify and isolate weak regions, which we define as continuous domains where the stress is within a given threshold from its maximal value.

Modal analysis can be used to identify weak regions, for reasons explained hereinbefore. The basic idea of modal analysis is to compute a number of eigenvectors of the stiffness matrix of the system object, which correspond to its "natural" vibration modes. Before converting modal displacement into stress, one normalizes all modal displacements so each of them require the same amount of energy to excite. Once normalized, displacements are converted to stresses using a standard linear elasticity model. FIGS. 4A-4D show the first four weak regions extracted from the indicated sample shape.

In the step of stress optimization, knowing the weak regions alone is not enough to determine whether a shape can be printed. The stress optimization step determines the maximum stress induced at each weak region with a fixed total force budget. If this stress exceeds the maximal permitted values, the structure may fail if the worst-case loading is applied. In its simplest form, the stress optimization can be formulated as a linear programming (LP) problem where we constrain the total magnitude of forces. Currently, the LP is solved using a well-known cvx package available at (http://cvxr.com/). This cvx computer software package is available under a GPL license, but a variety of other well-known and available packages exist for solving this type of problem.

Further examples of this type of analysis are shown in FIGS. 5A-5D and FIGS. 6A(1)-6A(4), 6B(1)-6B(4) and 6C(1)-6C(4).

Figure 7:
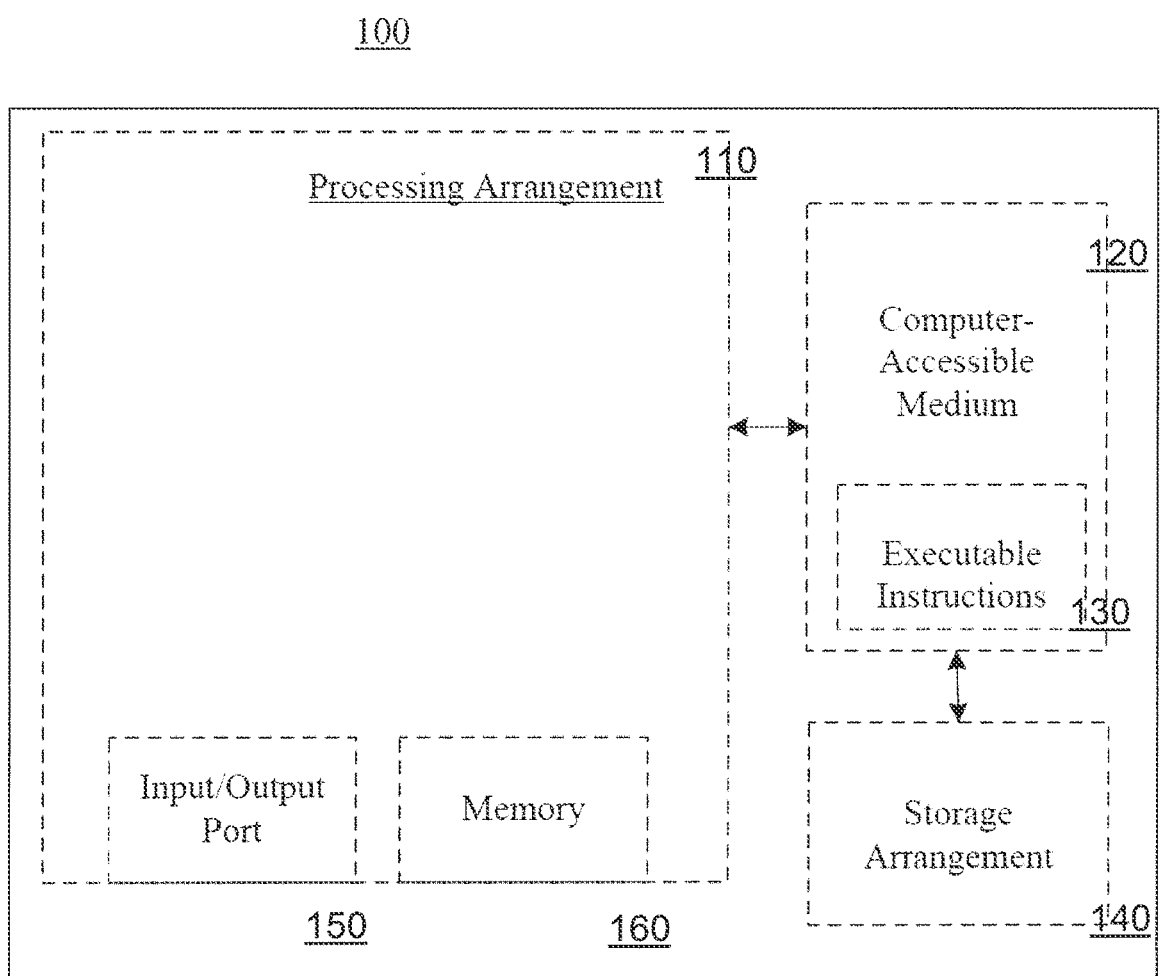
FIG. 7 illustrates a computer implemented system and method of one embodiment.
Figures 9A, 9B, 9C, 9D:
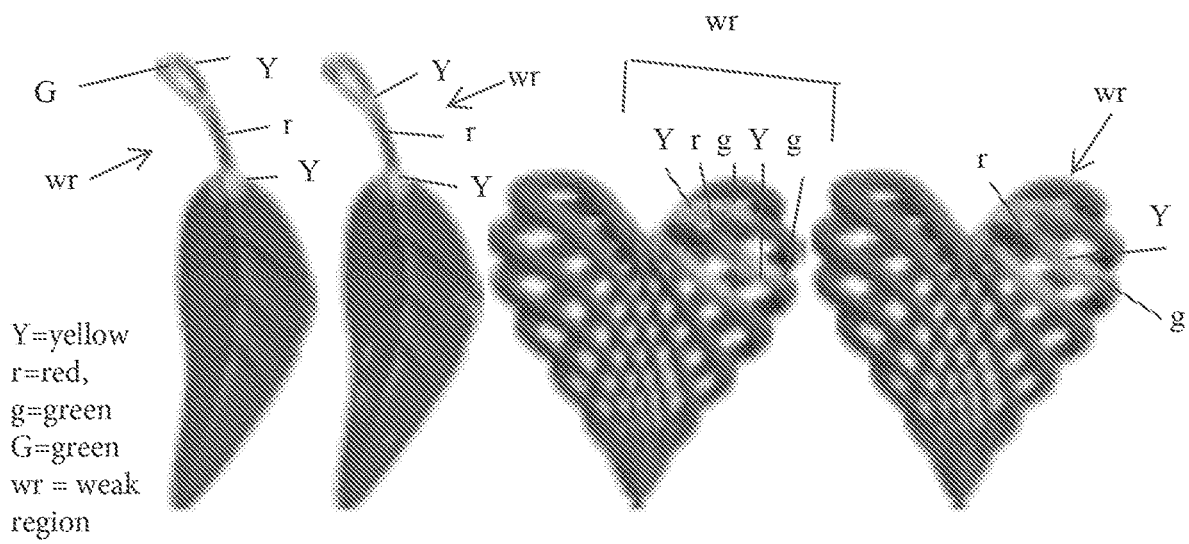
FIG. 9A illustrates the largest principal stress on one object.
FIG. 9B illustrates a largest trace on the one object.
FIG. 9C illustrates a largest principal stress on a second object and FIG. 9D illustrates a largest trace on the second object.

In one preferred embodiment of this first embodiment, shown in FIG. 7, a system 100 is provided for determining mechanically weak regions in an object as described. FIG. 7 shows an exemplary block diagram of a system 100 for both this first embodiment and for a second embodiment described hereinafter. For example, an exemplary procedure in accordance with these embodiments can be performed by a processing arrangement 110 and/or a computing arrangement 110. Such processing/computing arrangement 110 can be, e.g., entirely or a part of or include, but not limited to, a computer/processor that can include, e.g., one or more microprocessors, and use instructions stored on a computer-accessible medium (e.g., RAM, ROM, hard drive, or other storage device).

As shown in FIG. 7, e.g., a computer-accessible medium 120 (e.g., as described herein, a storage device such as a hard disk, floppy disk, memory stick, CD-ROM, RAM, ROM, etc., or a collection thereof) can be provided (e.g., in communication with the processing arrangement 110). The computer-accessible medium 120 may be a non-transitory computer-accessible medium. The computer-accessible medium 120 can contain executable instructions 130 thereon. In addition or alternatively, a storage arrangement 140 can be provided separately from the computer-accessible medium 120, which can provide the instructions to the processing arrangement 110 so as to configure the processing arrangement to execute certain exemplary procedures, processes and methods, as described herein, for example.

System 100 may also include a display or output device, an input device such as a key-board, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art can appreciate that such network computing environments can typically encompass many types of computer system configurations, including personal computers, hand-held devices, multi-processor systems, microprocessor-based or programmable consumer electronics, network PCs, minicomputers, mainframe computers, and the like. Embodiments of the invention may also be practiced in distributed computing environments where tasks are performed by local and remote processing devices that are linked (either by hard-wired links, wireless links, or by a combination of hardwired or wireless links) through a communications network. In a distributed computing environment, program modules may be located in both local and remote memory storage devices.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

In a second embodiment of the invention, in order to carry out the worst-case structural analysis, a formal description of the problem includes a computationally intractable formulation, but it is needed as a foundation for a practical and advantageous approximate version described hereinafter.

An anisotropic linear material model is used and the linear elasticity equations applied to model object behavior for the purposes of determining weak spots and worst-case force distribution. This model is adequate for some materials used in 3D printing, but nonlinear models may be necessary for others, as discussed in greater detail hereinafter. A distinction is emphasized that should be made between simulation with given loads used to determine precise stress distributions and computation used to determine approximate worst-case loads: lower accuracy is acceptable for the latter. The standard elasticity is included to introduce notation. The stress-strain relationship is linear, and stress is related linearly to displacement:

$$\sigma = C : \varepsilon \quad (1)$$
$$\varepsilon = \frac{1}{2}(\nabla u + \nabla u^T)$$

where $\varepsilon$ is the strain tensor, $\sigma$ is the stress tensor, and u is the displacement. C is the rank-4 elasticity tensor, $C_{ijlm}$, and the notation C: $\varepsilon$ denotes application of this tensor to the strain tensor $\varepsilon, \Sigma_{l,m} C_{ijlm} \varepsilon_{lm}$. The choice and effects of elasticity tensor C are discussed hereinafter in greater detail. An orthotropic material is assumed, for which the tensor $C_{ijlm}$ has up to 9 independent parameters. In a coordinate system aligned with material axes, if we represent C as a 6×6 matrix acting on vectors of components of the symmetric strain tensors $[\varepsilon_{11}, \varepsilon_{11}, \varepsilon_{22}, 2\varepsilon_{23}, 2\varepsilon_{31}, 2\varepsilon_{12}]$, its inverse is given by $$\begin{bmatrix} \frac{1}{Y_1} & -\frac{v_{21}}{Y_2} & -\frac{v_{31}}{Y_3} & 0 & 0 & 0 \\ -\frac{v_{12}}{Y_1} & \frac{1}{Y_2} & -\frac{v_{32}}{Y_3} & 0 & 0 & 0 \\ -\frac{v_{13}}{Y_1} & -\frac{v_{23}}{Y_2} & \frac{1}{Y_2} & 0 & 0 & 0 \\ 0 & 0 & 0 & \frac{1}{G_{23}} & 0 & 0 \\ 0 & 0 & 0 & 0 & \frac{1}{G_{31}} & 0 \\ 0 & 0 & 0 & 0 & 0 & \frac{1}{G_{12}} \end{bmatrix}$$

Where $Y_{ii}$ are directional Young moduli, $G_{ij}$ are shear moduli, and $v_{ij}/Y_i = v_{ji}/Y_j$.

For dynamic linear problems with volume force density F, the equation of motion is $$\nabla \cdot \sigma = F + \rho \ddot{u} \quad (2)$$

where $\rho$ is the density, and the dot signifies the time derivative. This is primarily directed to static problems, but modal analysis can be used at an intermediate stage, and thus the term $\rho \ddot{u}$ is retained.

Equation 2 is subject to boundary conditions: we primarily use a surface force density $F_s$, which is captured by the condition $\sigma n = -F_s$ on the boundary of the object. If the object is attached to a rigid support, Dirichlet conditions u=0 can be imposed on a part of the boundary.

If the equation of motion (2) is written directly in terms of displacement u, we get $$\nabla \cdot (C : (\nabla u + \nabla u^T)) := Lu = F + \rho \ddot{u} \quad (3)$$

Rigid motion, torque and translation constraints for static problems. If the object is not fixed at least at 3 non-collinear points, an arbitrary force distribution will result in motion of the whole object. The interest is in considering unknown forces, with no assumptions on attachment, and thus we need to be able to eliminate global motion. This is achieved by imposing zero total force and zero total torque constraints, which can be written as, $$\int_{\partial\Omega} F dV + \int_{\partial\Omega} F_s dA = 0,$$

$$\int_{\Omega} F \times (x - x_c) dV + \int_{\partial\Omega} F_s \times (x - x_c) dA = 0 \quad (4)$$

Displacements enter into this system only in the form Lu, and the operator L has infinitesimal rigid motions in its nullspace. To have a unique solution in u, we impose the zero rigid motion constraint, similar to total torque and force constraints:

$$\int_{\Omega} u dV = 0, \int_{\Omega} u \times (x - x_c) dv = 0 \quad (5)$$

In cases of interest for a surface force model, the only volume force is gravity. In all but most extreme cases, gravity does not have a major effect, so we concentrate on surface forces. The forces of interest are restricted in three ways.

Only positive normal forces are allowed: $F_s = -pn$, where n is the surface normal, and p is pressure, thus ignoring friction. This is an important assumption, as for most situations described hereinbefore, friction forces are likely to be significantly lower than normal forces. At the same time, it is hard to model the bounds on ratios between normal and tangential components accurately in the absence of detailed knowledge of loads and surfaces. Without such bounds, any optimization is likely to produce unrealistic tangential results. Similarly, negative surface forces (e.g., electrostatic attraction), are not likely to play a major role and are excluded.

For the condition of pointwise pressure bounded: $p < p_{max}$. If a pressure can be unbounded, an arbitrarily high stress may be produced at a point on the surface. While highly concentrated forces are possible, these are rare, and it is assumed that a realistic bound on surface pressure is available.

For the total force is fixed, again, by increasing the total force, arbitrarily high stresses can be obtained. For example, if our primary target is simulating manual handling situations, one can bound the force by a typical force a human can apply by squeezing, and the maximal pressure is derived from the size of the finger tips.

It remains to specify the objective function. One commonly used measure of interest is maximal principal stress, $\max_{\Omega} \max_{i=1,2,3} |\sigma_i|$, where $\sigma_i$ are the eigenvalues of the stress tensor. The complete problem of finding the worst-case force distribution satisfying the constraints of our model and optimizing this objective function, has the form, $$\max_{\Omega} \max_{i=1,2,3} |\sigma_i| \to \max; \quad (6)$$

$$Lu = 0 \text{ on } \Omega, C:(\nabla u + \nabla u^T)n = pn \text{ on } \partial\Omega,$$

$$\int_{\partial\Omega} pn dA = 0, \int_{\partial\Omega} pn \times (x - x_c) dA = 0,$$

$$\int_{\Omega} u dV = 0 \int_{\Omega} u \times (x - x_c) dV = 0,$$

$$p \geq 0, p \leq p_{max} \text{ on } \partial\Omega, \int_{\partial\Omega} pdA = F_{tot}$$

Maximal principle stress is a suitable measure if one is interested in failure of materials, which occurs when the stress in a direction exceeds a bound. For plastic transition, the norm or some other function of the deviatoric stress, $$\sigma - \frac{1}{3} tr\sigma I,$$

can be of interest.

One observation can be made when the material is isotropic; and C can be written as $Y\hat{C}$, where Y is the Young modulus, and $\hat{C}$ is nondimensional, depending only on the Poisson ratio. Then maximal stress does not depend on Y but only on the Poisson ratio.

Solving this problem yields the worst-case principal stress and, importantly, the pressure distribution on the surface resulting in this stress. The maximal stress makes it possible to evaluate the likelihood of damage during the production process, shipping or use. Examining the pressure distribution makes it possible to evaluate how likely such loads would be and determine how the structure of the object can be strengthened.

All constraints in this problem are observed to be of linear equality and inequality constraints, i.e., the constraints are convex. At the same time, the functional is highly non-linear (in fact, not smooth) and non-convex. Replacing maximal principal stress with another point measure maximized over the surface does not change the nature of the problem.

A brute-force solution can be obtained by solving a sequence of problems in which the objective functional max $|\sigma_1|^2$ is maximized for every point, and then the max is taken over all results. Because we are interested in maximizing the norm, even these simpler per-point problems remain non-convex and nonlinear. Solving the optimization problem in general form is generally impractical, and due to non-linearities and non-convexity, any optimization is likely to get stuck in local minima.

An extension of the algorithm is directed to optimizing for maximal displacements. The main change is replacing a with u in the functional: $\max_\Omega |u| \to \max$. This formulation is more relevant for flexible materials.

An illustration of an efficient approximate algorithm methodology, FIGS. 8(a)-8(e) shows the main components of processing the efficient approximate algorithm for solving Equation (6).

There are two problems to address to make the solution of Eqn. (6) practical: (1) the need to solve an optimization problem for each point of the object to determine which one results in minimal stress; and (2) the non linearity and nonconvexity of each subproblem.

To address the first problem, a modal-analysis based heuristic is used that works remarkably well. The second problem is solved by using tr σ as the linear objective functional. The reasons this substitution is possible for a broad range of cases are discussed in detail below. Modal analysis and weak region is a crucial ingredient of our method, which is used to restrict the part of the object where one needs to maximize the stress or another functional.

Computational modal analysis refers to computing eigenvectors (eigenmodes) $u_i$ and eigenvalues $\lambda_i$ of L:

$$Lu_i = \lambda_i u_i, i=1,2 \quad (7)$$

In the context of structural analysis, this modal analysis is to predict possible damage or deformations in presence of vibrations. Vibrations, i.e., periodically changing loads are not considered; rather, static or quasi-static loads are considered in the prior art. The following assumptions were used in this second embodiment of the invention:

Assumption 1: Examining a small number of eigenmodes allows us to find all regions of an object where the stress may be high under arbitrary deformation. While this observation is difficult to prove mathematically, reasonable logic suggests that vibrations of an object at different frequencies will result in high stress in all structurally weak regions of the object. Weak regions are those where high maximal stress can be obtained with low energy density relative to other parts of the object.

To validate this assumption, a brute-force optimization was performed on a number of models (see FIGS. 14(a)(1)-14(a)(2)) and compared with the results obtained using weak regions only. We obtain a remarkably good agreement in all cases. Locations are searched for potentially high stress by computing a number, $M_m$ of eigenmodes and considering a fraction 1-ε of points with highest stress under these deformations. Weak regions are defined to be the connected components of this set. Each mode has multiple weak regions, typically associated with local stress maxima. For each mode we select AL, weak regions.

The approximate convex problem is concerned with the second important change to the problem by replacing the functional in Eqn. (6) with a functional that can be optimized efficiently and that is minimized by a similar pressure distribution, p, to the original. Focus is thus on the maximal stress, although a similar approach can be used for other functionals. It is observed that almost invariably for any deformation and any compressible material with Poisson ratio v sufficiently different from ½: For points where a principal stress is maximal, other principal stresses are small relative to the principal stress.

Validation was performed of this observation by running simulations with a variety of loads and computing the ratio of the maximal principal stress to |trσ|. Over 36 models tested, the average ratio is 0.96 with standard deviation 0.25. FIGS. 9a-9d illustrates that the distributions of trace and maximal principle stress are visually similar.

When this is true, the difference between $|\sigma_{max}| = \max_{i=1,2,3}|\sigma_i|$ and $|\Sigma^3_{i=1}\sigma_i|$, i.e., |trσ| is so small, and one can approximate the maximal principal stress with the absolute value of the trace. Finally, it is noted that problems can be solved separately for maximal compressive stress, approximated by -tr σ, and tensile stress, approximated by tr σ. Thus focus is on the tensile stress.

As weak regions correspond to the highest stress area, and estimated stress tends to have a significantly lower accuracy vs. displacement, a weighted average is used of the stress over each weak region. The choice of weighting, as long as it falls off towards the boundary of the region, has relatively small effect on the result. We choose the $L_2$ norm of the stress computed from the eigenmode as the weight w for averaging the stress trace over each weak region.

The following approximate problem formulation is obtained:

For each eigenmode i, i=1 ... $M_m$ and each of its weak legions, $D_{ij}$, j=1 ... $M_r$, we solve the following linear programming problem:

$$\int_\Omega tr\sigma dV \to \min;$$

$$Lu=0 \text{ on } \Omega, C:(\nabla u + \nabla u^T)n = pn \text{ on } \partial\Omega$$

$$\int_{\partial\Omega} pndA = 0, \int_{\partial\Omega} pn \times (x-x_c) dA = 0,$$

$$p \geq 0, p \leq p_{max} \text{ on } \partial\Omega; \int_{\partial\Omega} pdA = F_{tot} \quad (8)$$

Unlike the original problem, this problem has a unique solution that can be computed efficiently using a convex solver.

A discretization and additional optimizations embodiment solves another part of the problem. The problem can be discretized in the simplest conventional way, using piecewise-linear finite elements. The downside of this approach is that a suitable tetrahedral mesh needs to be generated for each input. For 3D printed models, the task is somewhat simplified: as the cost of printing is dominated by the amount of material used, almost all objects printed in practice are effectively thick shells to the extent this is allowed by the structural requirements. For this reason, the meshing does not increase the number of vertices used to represent the object as much as one would expect.

Let n, be the number of vertices, $n_b \leq n$ be the number of boundary vertices, and m be the number of elements. The discretized quantities are: p the vector of pressures defined at boundary vertices of dimension $n_b$; and u, the vector of displacements of dimension 3n.

In discrete formulation, we optimize the functional, $$w^T V D Bu \quad (9)$$

In this formula, V is a 6m×6m matrix, with the volume of element j repeated 6 times on the diagonal for the 6 components of the stress tensor. D is a 6m×6m block-diagonal matrix. For each element, the corresponding 6×6 block is the rank-4 tensor C in matrix form. B is a 6m×3n applying the FEM discretization (or applying a conventional FV or other like function) of $\nabla + \nabla^T$. Finally, $w^T$ is a vector that computes and weights the stress tensor weights, so that $w^T V x$ discretizes $\int_\Omega wtrxdV$.

The discretized static elasticity equation combined with boundary conditions takes the form $$-Ku+NAp=0 \quad (10)$$

where K is the standard FEM 3n×3n, stiffness matrix, $K=B^T V DB$. The matrix N is a 3n×$n_b$ matrix of components of surface normals, returning per-vertex components of external forces (0 for internal vertices, pn for the boundary), and matrix A is the $n_b \times n_b$, diagonal vertex area matrix.

The discretized formulation of the total force and torque constraints are:

$$\Sigma N \, Ap=0, \Sigma T \, N \, Ap=0 \quad (11)$$

where $\Sigma$ is the 3×3n matrix, summing n 3d vectors concatenated into a 3n vector, and T is 3n×3n block-diagonal matrix computing the torques of the surface force vectors.

Putting all these together, the discretized optimization problem is:

$$w \cdot (V D Bu) \to \max \text{ w.r.t. } u \text{ and } p$$

$$-Ku+N \, Ap=0,$$

$$\Sigma N \, Ap=0, \Sigma T \, N \, Ap=0$$

$$\Sigma_v u=0, \Sigma_v T_v u=0$$

$$0 \leq p_i \leq p_{max} \text{ for all } i$$

$$\Sigma_s Ap=F_{tot} \quad (12)$$

where $\Sigma_s$ sums scalars on the surface, $\Sigma_v$, sums vectors in the volume $\Omega$, and $T_v$ computes torsion for each point. The total dimension of the problem is $n_b+3n$.

Eliminating displacements embodiment. As most of the degrees of freedom in the system are displacements, but quantities of interest are pressures p, eliminating u results in significant calculational speedups (u can be eliminated even for the displacement maximization problem). The elasticity equation $-Ku+Nap=0$ is not sufficient for this; it has a nullspace of dimension 6 corresponding rigid motion degrees of freedom, so we need to consider the constraints for zero total rigid motion, Ru=0, where $$R = \begin{bmatrix} \sum_v \\ \sum_v T \end{bmatrix}.$$

Rewriting this system in the standard constrained system form, $$\underbrace{\begin{bmatrix} K & R^T \\ R & 0 \end{bmatrix}}_{C^*} \begin{bmatrix} u \\ \lambda \end{bmatrix} = \begin{bmatrix} NAp \\ 0 \end{bmatrix} \quad (13)$$

where $\lambda$ is the Lagrange multiplier for the constraint Ru=0. It is clear from physical considerations that this system is invertible. Let S be the selection matrix $$\begin{bmatrix} I_{3n \times 3n} \\ O \end{bmatrix}.$$

Then, we can express u as $u=S^T C^{*-1} SNAp$. In this form, the objective of Eqn. (12) becomes $$w \cdot VDBu = \underbrace{w^T VDBS^T C^{*-1} SNA}_{f^T} p = f^T p$$

The displacement-free optimization problem is, $$f^T p \to \max,$$

$$\Sigma N \, Ap=0, \Sigma T \, N \, Ap=0,$$

$$p \geq 0$$

$$\Sigma_s Ap=F_{tot} \quad (14)$$

While the final system has only sparse constraint matrices, it may appear that computing $f^T$ for the objective functional requires inverting $C^*$; we observe however that $w^T VDBS^T C^{*-1} SNA = f^T$ can be rewritten as $f=(SNA)^T q$, where q is the solution of the equation $$C^{*T}_q = SB^T D^T V^T w \quad (15)$$

In other words, it is sufficient to be able to solve a linear system with matrix C*, and the cost of transforming Eqn. (12) to Eqn. (15) is the cost of a single linear solve.

Finally, for modal analysis, it is observed that the results for isotropic models in particular are well-approximated by simpler eigenanalysis of the Laplacian, which yields a considerable speedup.

Algorithm summary and parameters. The main steps in this second embodiment:

1. Compute a tetrahedral mesh $\Omega$ for an input triangle mesh.
2. Compute $M_m$, modes using an eigensolver.
3. For each mode, find $M_r$ weak regions with highest total energy.
4. For each region $D_i$ solve the problem Eqn. (14) to obtain worst case pressure candidate $p_i$.
5. Solve Lu=0, with boundary pressures specified by $p_i$, to obtain displacements $u_i$, and compute actual maximal principal stress $\sigma_i^{max}$ for each weak region.
6. Maximal stress is determined as maximum of $\sigma_i^{max}$.

Various conventional available software packages are used including MOSEK to solve the linear programming problem, UMFPACK for linear solves, and ARPACK for computing eigenvectors and eigenvalues. Other well-known conventional packages can be used.

The parameters of the algorithm include $M_m$, $M_r$, the choice of threshold 1-$\varepsilon$ for weak regions, as well as user-defined maximal pressure $\rho^{max}$ (the latter can be regarded as a part of the definition of the force model).

Figure 10:
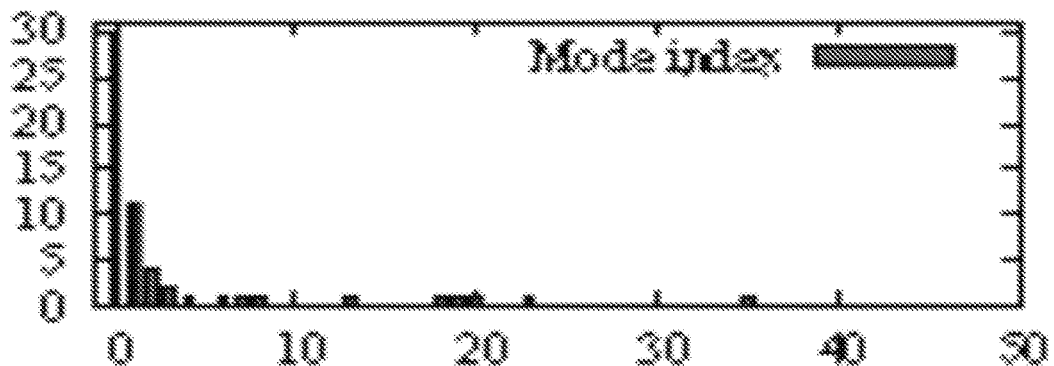
FIG. 10 illustrates a histogram of a mode number (horizontal axis) in which the weakest region appears for a first time.

To determine reasonable choices of $M_m$ and $M_r$, and the modal analysis has been run for a large number of modes (50); and a large number of weak regions per mode for a collection of objects. For each object and each mode, the weakest region was found and checked in which mode it first appears. Its rank in the list of that mode's weak regions was computed and sorted by decreasing energy. The results (FIGS. 10 and 11) indicate that 5 modes and 5 weak regions per mode are sufficient in 95% of cases.

Figure 11:
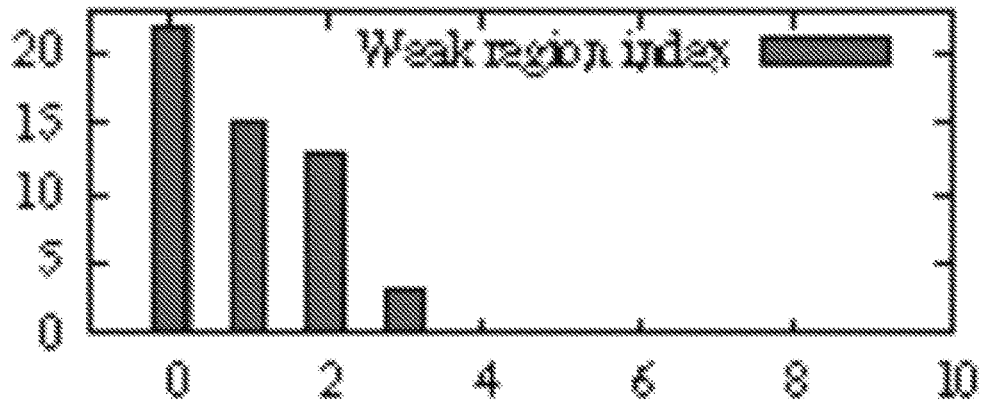
FIG. 11 illustrates a histogram of rank of the weakest region in a weak region list sorted by decreasing energy.
Figures 12A, 12B, 12C, 12D:
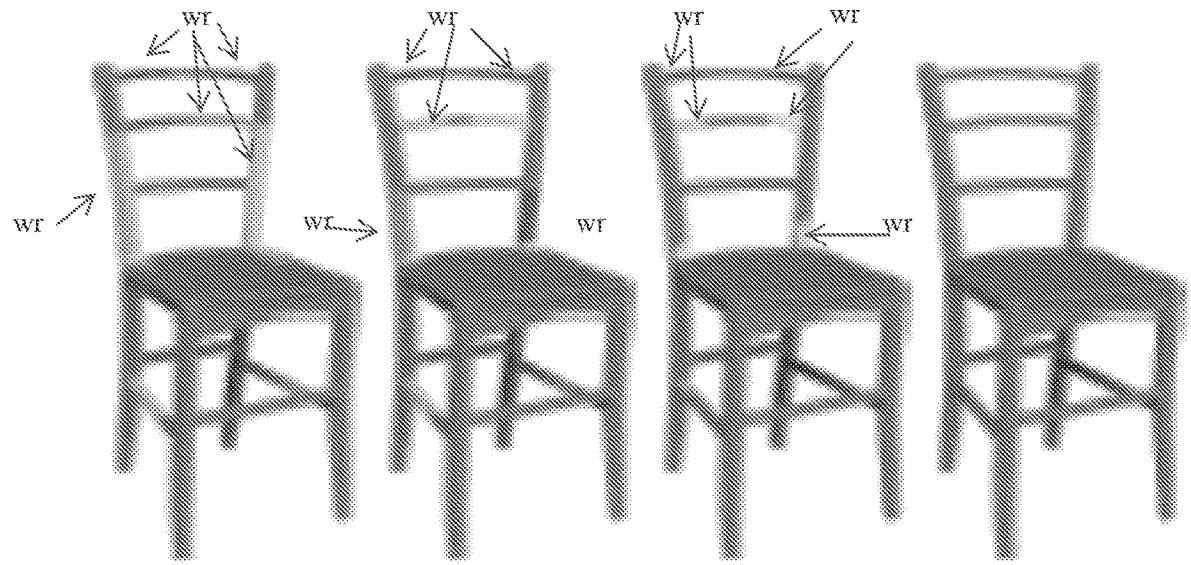
FIGS. 12A-12D show weak regions extracted from three modes with weakness level cutoff, ε=0.10. 0.05, 0.03, and 0.01, respectively.
Figures 13A, 13B, 13C, 13D:
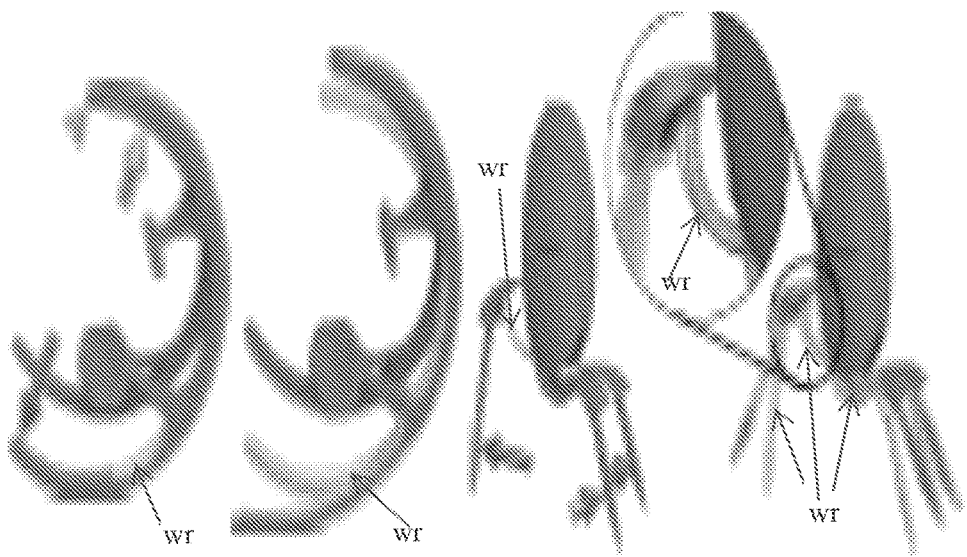
FIGS. 13A-13D shows optimal force vectors and weakest regions on the left with resulting deformations and stresses on the right and gray images in the background show the undeformed state.

We use $\varepsilon=0.025$ in all cases; the dependence of the size of weak regions for one mode on $\varepsilon$ is shown in FIG. 11.

FIGS. 12(a)-12(d) show two final results of the algorithm. Red ("r") arrows are total forces obtained by summing nearby per-vertex force values (pressures are typically concentrated in small areas). Colormaps on the deformed surfaces show weakness maps.

Validation of the methodologies were done in several computational and experimental ways. Comparison with direct search for the weakest region. Instead of using the modal analysis stage to identify weak regions and using averaged stress or displacement over weak regions as the target quantity to optimize, the same optimization process can be run directly, treating each tetrahedron as a potential weak region.

The weakness map is defined as a scalar field on the surface mapping each point to the maximal principal stress at this point obtained by approximate optimization. Using our method yields a partial weakness map on the union of all weakness regions we consider. FIGS. 14(a)(1)-14(a)(2) show a comparison of a complete weakness map, computed using the brute-force approach, with the weakness map obtained by our method. A close agreement is found between these for all examples in areas where the partial map is defined, and never observe high stress values elsewhere.

TABLE 1

Stress analysis timings for brute farce optimization vs. weak region optimization

| # Tets | Brute Force (s) | Weak Region (s) | Speedup |
|---|---|---|---|
| 2723 | 681.367 | 1.089 | 625.939 x |
| 2869 | 793.362 | 1.087 | 729.907 x |
| 2904 | 894.610 | 0.641 | 1396.071 x |
| 4149 | 1949.444 | 2.568 | 759.205 x |
| 5332 | 2120.361 | 1.171 | 1810.199 x |
| 11020 | 11029.721 | 2.729 | 4042.403 x |
| 12853 | 11334.362 | 1.694 | 6692.546 x |
| 12923 | 11203.547 | 1.843 | 6078.623 x |
| 14163 | 27775.900 | 3.373 | 8234.925 x |
| 14397 | 37494.433 | 18.524 | 2024.114 x |
| 16008 | 19917.838 | 1.892 | 10527.388 x |
| 16873 | 33937.877 | 3.210 | 10571.191 x |

While speedups are already dramatic for extremely small element counts, the higher asymptotic complexity of brute force causes a rapidly increasing speedup for larger models.

Dependence on tetrahedral mesh resolution. To keep the cost of computation low, especially in the context of interactive applications or processing large number of objects at a printing facility, using coarse tetrahedral meshes is desirable. As FIGS. 15(a)-15(f) show, weakness maps for different resolutions are similar, so higher resolution may be used only at the last stage, after the weakest spots are identified.

Drop test. To verify the method for brittle materials, a randomized force test was done by dropping printed models onto horizontal pegs. These models were dropped from 1 m high, ensuring a nearly random impact orientation and force application. The test setup is pictured in FIGS. 16(a) and (b). All models were printed with material zp150.

Figure 17L:
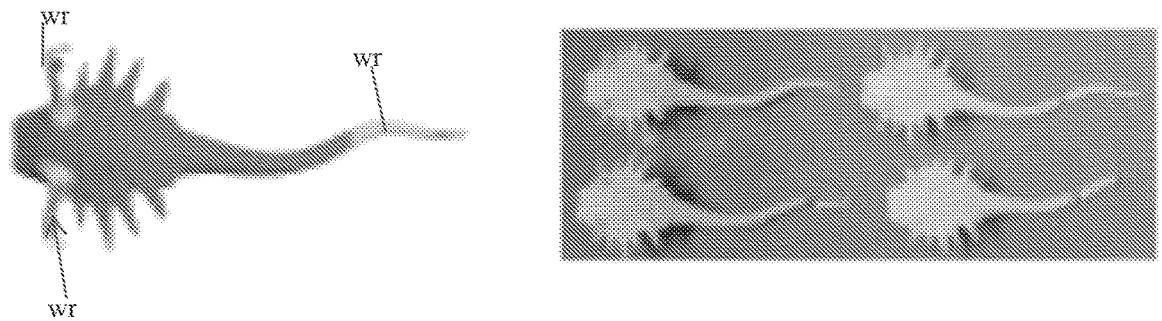
FIGS. 17A-17Q illustrate numerous results which show weak regions which agree with areas of highest probability of fracture.
Figure 17M:
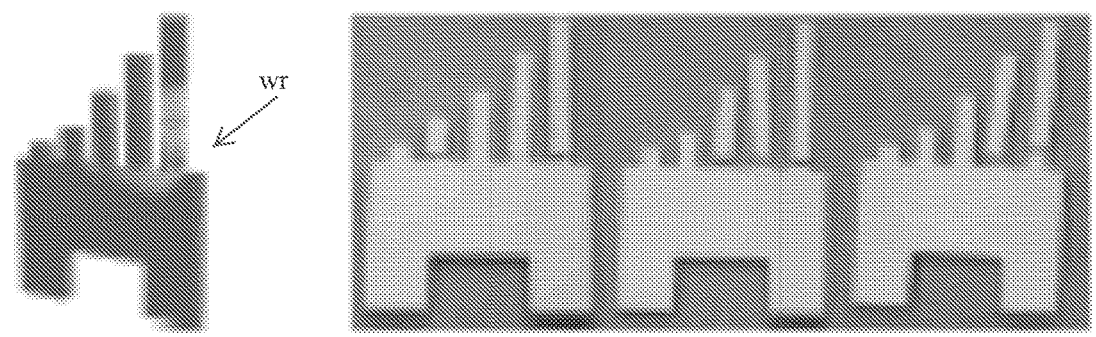
Figure 17N:
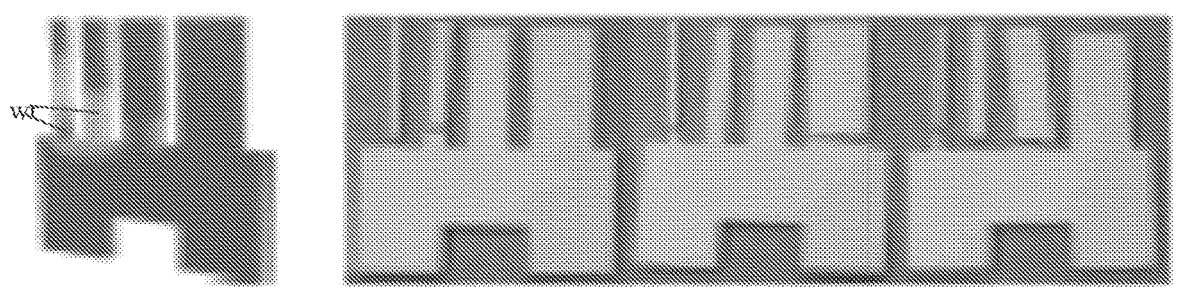

The testing results, displayed in FIGS. 17(a)-17(q), confirm that weak regions determined by our method agree with areas with highest probability of fracture. Notice in particular the legs of the cow (3$^{rd}$ row, left), the notches of the gear (5$^{th}$ row, left), the arms of the chair (5$^{th}$ row, right), and the inner piece of the powercog pendant (6$^{th}$, row left). Those are all regions of high weakness map value that break quite consistently.

For the objects printed in ductile materials, a different test was performed. The shapes were placed into a cardboard box filled with packaging material and applied pressure to the box's exterior. This pressure permanently deformed the models inside. Photographs were obtained of the deformed models in a registered position and compared them to the 3D model from which they were printed. Good agreement was observed with the computed map of maximum displacements, i.e., the map similar to the weakness map, but for the displacement maximization problem.

The approach described was compared to certain prior art, as they aim to predict the loads that a printed model is likely to experience. In this invention a more specific force model was used: pinch grips. The prior art presents an empirical model to predict how the object will be gripped with two fingers. There are many designs for which such a grip does not capture typical use cases or mishaps. FIGS. 19(a)-19(d) demonstrates shapes whose worst-case loads cannot be applied or approximated using only a pinch grip.

FIGS. 20(a)-20(d)(2) show three examples for which the above-referenced prior art have provided their force application points. Their "cup" example (left) is an excellent candidate for the pinch grip, the highest stress achieved with a fixed total force agrees with ours, and even exceeds it. However, the other two objects do not fit their model as well. The "UFO" pinch grip is clearly suboptimal, and the forces applied to the bracelet would have much more leverage if they were moved to the open endpoints. In all three cases, our method generates efficient force vectors.

It was observed that the "cup" model herein produces a triangle of forces (perhaps at the expense of higher stress) rather than a pair of opposite forces. One possible reason for this is the pressure bound requiring the force to be distributed over a larger area.

Though our pipeline has not yet reached interactive speeds, it is already fast enough to be included in a 3D printing pipeline, For the sizes of models most commonly sent to 3D printing services (see distribution in FIG. 22, sizes on the order of 100 k faces are most common), and the instant full algorithm takes only a few minutes to complete:

| # Tets | Structural Analysis (mins) |
|---|---|
| 2723 | 0.028 |
| 42900 | 0.308 |
| 70356 | 0.382 |
| 155383 | 2.566 |
| 322398 | 9.601 |
| 414894 | 4.490 |

Analyzing the algorithm's scaling behavior is complicated by its dependence on structural properties—a separate linear program is run for each weak region that is extracted. To make sense of the timings, they have been separated by stage. Modal analysis and weak region extraction are run only once per model; FIGS. 21($a$)-21($b$) shows how the execution time depends on the element count. The time spent setting up and solving the linear programs ("weakness analysis") is averaged over all weak regions so that it can be plotted against the same x axis. Note that there is one further cost not shown: the single sparse UMFPACK factorization, This tinting depends strongly on matrix structure (despite using fill-in reducing permutations), and adds noise to curves when included. Factorization time is included in the timing table above.

Material Properties

Material parameters defining the elasticity tensor C must be measured for each of the 3D printers' materials. It was observed that the computed maximal stress does not depend on the magnitude of the Young modulus in the isotropic case. However, in the anisotropic case, it does depend on the ratios of directional elasticity moduli, which can be significant (see FIG. 16). To predict breakage or plastic deformations under loads, the additional material parameters tensile strength and yield strength are needed.

Young's modulus ratio measurements were taken and are shown for three different 3D printing materials that were used to compute our simulation's elasticity parameters. In addition, the extent is described to which various materials match our assumptions on stress strain linearity and what accuracy one can expect from predictions of the maximal stress to tensile strength ratio. In all cases, a Poisson ratio of 0.3 was assumed.

Three materials were used in 3D printing: nylon (PA 2200 by EOS Electro Optical Systems), "sandstone" (zpI50 used in the Zprinter series by 3D Systems), and green state stainless steel (420SS powder bound with proprietary binder used by ExOne). They also represent different classes of materials (brittle vs. ductile, isotropic vs. anisotropic).

Figure 24:
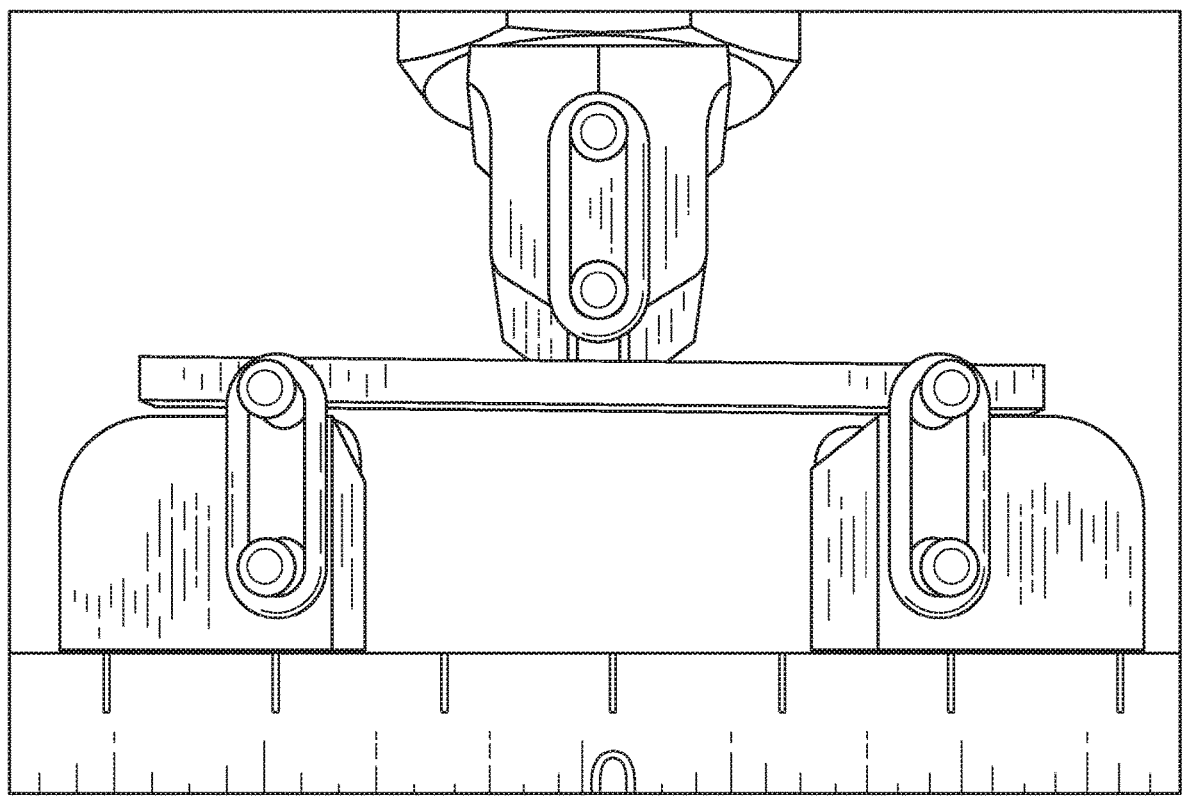
FIG. 24 shows a three point bending test on a green state stainless steel.

To determine their properties a three point bending test was conducted consistent with ASTM standard D5032 ([ASTM 20077]), using the Instron 5960 universal testing machine with a ±1OON load cell and a support span of 40 mm. FIG. 24 illustrates the testing setup. The testing samples are rectangular bars with length 60 mm and thickness between 1 mm and 5 mm. A relatively thin test bar was chosen because structurally weak models are likely to contain thin features.

Figures 25A, 25B:
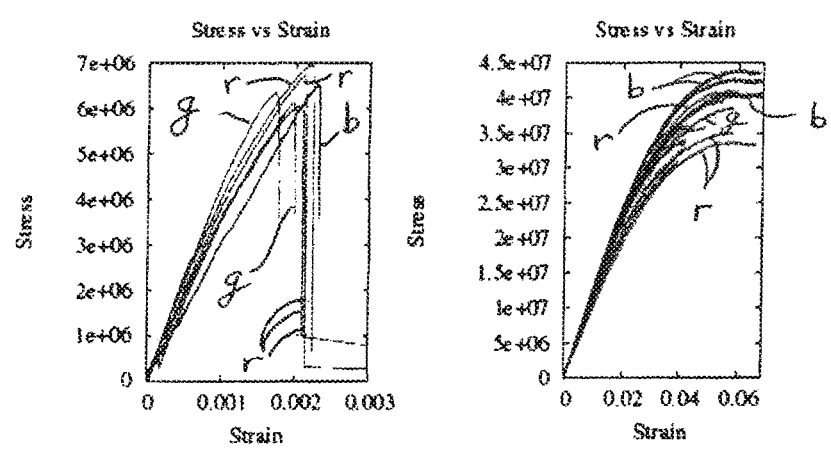
FIG. 25A shows a stress v. strain curve measured on sample in a green state stainless steel, wherein sample thickness is 1.5 mm (red or "r"); 2 mm (green or "g"); 3 mm (blue or "b")
FIG. 25B shows stress v. strain plots for nylon testing samples of thickness of 1.5 mm and 2 mm and samples printed in different orientation are marked with different colors ("r"=X, "g"=Y and "b"=Z)
Figure 26:
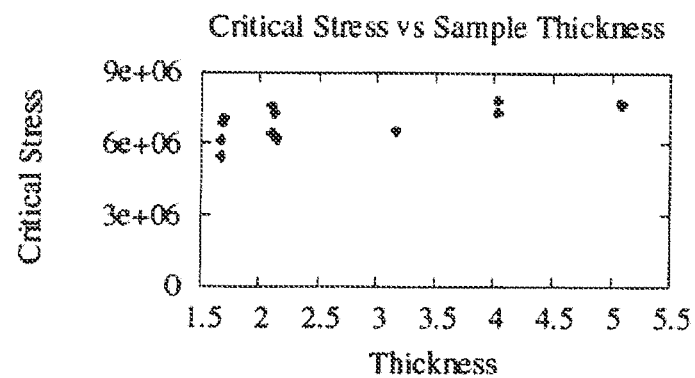
FIG. 26 illustrates a plot of critical stress distribution of green state metal for samples with thickness 1.5 mm up to 5 mm.
Figure 27:
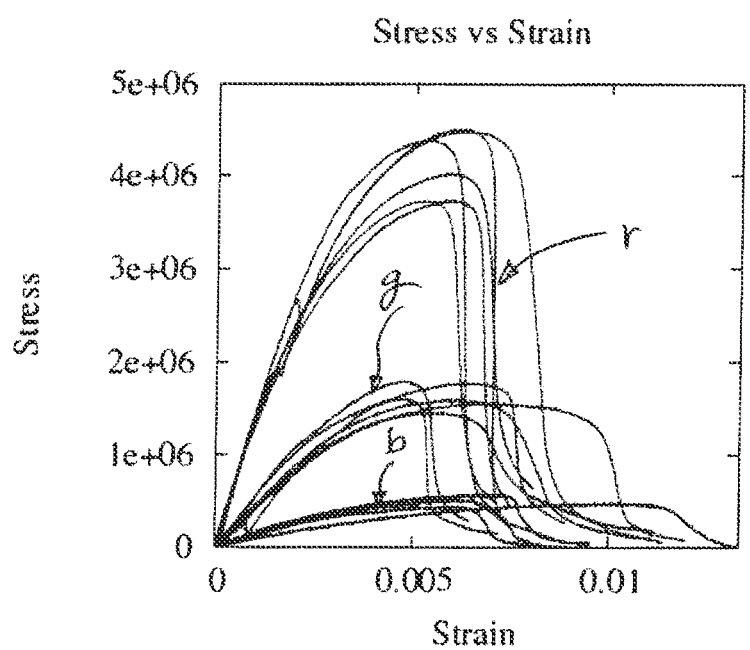
FIG. 27 illustrates a plot of stress v. strain measurements on rectangular bars printed with green state "sandstone" along the printer X ("r"); Y ("g"); and Z ("b") directions wherein different printing directions influence the material properties substantially.

Among the three materials tested, green state stainless steel fits the definition of brittle material the best. Stress grows linearly with strain for all samples tested (FIGS. 25($a$)-25($b$) left). Bending tests in perpendicular directions show that elastic moduli in these directions are close, with the average Young modulus 3.59 Gpa and standard deviation 0.27 Gpa. FIG. 26 shows critical stress extracted from measurements, which is mostly consistent for all samples, with the average 6.88 Mpa and 0.62 Mpa standard deviation. Overall, this material is consistent with our model for stress optimization.

Models printed in nylon are known to withstand a large range of deformations. FIGS. 25($a$)-25)(b) (right) shows the stress vs strain curve for 18 nylon samples. Half of them are 1.5 mm thick, and the other half are 2 mm. For each thickness group, sets of 3 samples were printed along each of X, Y and Z directions. From the results, it was observed that nylon samples typically have a very large elastic deformation range before entering the plastic stage. We also note a moderate but obviously present degree of anisotropy (the Young's modulus for X is 0.80 Gpa with 0.13 Gpa deviation, for Y is 1.02 Gpa with 0.18 Gpa deviation, and for Z is 0.98 Gpa with 0.12 Gpa deviation). (See FIG. 25($a$)-25($b$)).

The most complex material tested was the "sandstone." Though, like green state metal, it has a relatively low tensile strength, it exhibits a significant plastic region (see FIG. 20) and very high degree of anisotropy: we measured X, Y. and Z Young's moduli of 1.22 Gpa (standard deviation 0.13 Gpa), 0.68 Gpa (standard deviation 0.07 Gpa), and 0.234 Gpa (standard deviation 0.02 Gpa) respectively, with more than 5 times difference between the largest and lowest values. Thus, we model it as an orthotropic material with a distinct Young's modulus per printing axis. The shear moduli was obtained using a standard well-known formula [see SolidWorks 2011]. Note that "sandstone" exhibits a large variability of tensile strength, even for a single direction. This means only very conservative predictions are possible. Nevertheless, it was observed that the weak region detection methodology works well for 10.

An efficient approximation method and system have been described for determining worst-case loads for a geometric object based on its geometry and material properties only. The method is quite reliable (it relies on a linear solver, an eigensolver, and a convex solver, which all can provide convergence guarantees), efficient, and approximates well worst-case stress and displacement distributions.

Only linear elasticity is considered, and the optimized solution at the second stage may not match reality for certain large plastic deformations. We note, however, that the robustly obtained approximate solution can serve as a starting point for a nonlinear solver that would find a more accurate local-minimum solution nearby. More generally, 3D printed materials exhibit a broad range of complex behaviors, some of which may exhibit considerable variation even for the same printing process. Using computational models reflecting material complexity and uncertainty is an important future direction. From the point of view of robustness of the method, tetrahedral mesh generation is the bottleneck. Meshless techniques may yield a fully robust pipeline using only surface geometry as input.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of determining weak spots in an object, comprising the steps of:
   determining maximal principal stress on each selected point of the object and
   obtaining a corresponding pressure distribution and selecting the pressure distribution corresponding to the point for which maximal stress is the greatest thereby determining the weak spots on the object;
   wherein an objective function is further provided to determine optimization, wherein the objective function comprises:

$$\max_{\Omega} \max_{i=1,2,3} |\sigma_i| \to \max;$$

$$Lu = 0 \text{ on } \Omega, C:(\nabla u + \nabla u^T)n = pn \text{ on } \partial\Omega,$$

$$\int_{\partial\Omega} pndA = 0, \int_{\partial\Omega} pn \times (x - x_c)dA = 0,$$

$$\int_{\Omega} udV = 0 \int_{\Omega} u \times (x - x_c)dV = 0,$$

$$p \geq 0, p \leq p_{max} \text{ on } \partial\Omega, \int_{\partial\Omega} pdA = F_{tot}$$

wherein sigma_i is the i-th singular value of the stress tensor,
   u is the displacements of the deformed body,
   Omega is the material domain, d Omega is its boundary,
   C is the elasticity 4-tensor,
   n is the normal to the boundary of n,
   p is the external pressure applied,
   x is the integration variable,
   $x_c$ is the position of the center of mass,
   dA denotes 2D surface integration,
   dV denotes 3D volume integration,
   $F_{tot}$ is the total applied force, and
   $p_{max}$ is the maximal allowable external pressure;
   determining whether to 3-D print the object based upon the determined weak spots and the determined optimization by comparison to a maximum permitted stress value, wherein the object may be printed if the determined optimization results in a maximal principal stress greater than the maximum permitted stress at any point of the object.

2. The method as defined in claim 1 wherein the maximal principal stress is replaced by a displacement norm |mμ| in the objective function, thereby optimizing the objective function for maximal displacements of the object.

3. The method as defined in claim 1 wherein a portion of the object is selected for determination of an objective function, thereby establishing maximum stress for a limited area of the object.

4. The method as defined in claim 3 wherein the step of selection comprises performing a computational modal analysis.

5. The method as defined in claim 4 wherein the computational modal analysis comprises computing eigenvectors, μ, and eigenvalues λ, of L wherein, $$Lu_i = \lambda_i U_i, i=1,2,3 \ldots$$

6. The method as defined in claim 1 wherein the objective function is replaced with an approximate convex function by assuming a primary principal stress as being maximized and other principal stresses are presumed small relative to the primary principal stress.

7. The method as defined in claim 6 wherein solving the convex function is separated into steps of solving for maximal compressive stress and maximal tensile stress.

8. The method as defined in claim 5 wherein stress in the weak region is determined by using a weighted average L2 of all stress values over each of the weak regions, wherein L2 is calculated from the eigenvectors wherein for each of the eigenvectors i, i=1... Mm and each of the weak regions Dij, j–1 ... Mn and solving $$\int \omega tr\sigma dV \to \min;$$

$$Lu=0 \text{ on } \Omega, C:(\nabla u+\nabla u^T)n=pn \text{ on } \partial\Omega$$

$$\int_{\partial\Omega} pndA=0, \int_{\partial\Omega} pn\times(x-x_c)dA=0,$$

$$p\geq 0, p\leq p_{max} \text{ on } \partial\Omega; \int_{\partial\Omega} pdA=F_{tot}.$$

9. The method as defined in claim 1 wherein the objective function is solved by a step of discretization using piecewise-linear finite elements and optimizing, $$W^T MBu$$

where B is a matrix discretizing a strain operator, whereby applying an FEM discretization method to the vector of displacements u, yields a vector of values of strain, with 6 components per strain value, and M is a matrix representing the application of a rank-4 tensor C to strain values, thereby yielding a vector of stress components.

10. The method as defined in claim 9 including the step of eliminating displacements u, thereby accelerating determination of object pressures, p.

* * * * *